US011734110B1

(12) United States Patent
Rijo et al.

(10) Patent No.: US 11,734,110 B1
(45) Date of Patent: Aug. 22, 2023

(54) STORAGE DEVICE RECLASSIFICATION SYSTEM

(71) Applicant: Dell Products L.P., Round Rock, TX (US)

(72) Inventors: Michael Rijo, San Jose, CA (US); Samuel Hudson, Foxborough, MA (US); Robert Proulx, Holden, MA (US); Erhan Aslan, Jamaica Plain, MA (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/730,815

(22) Filed: Apr. 27, 2022

(51) Int. Cl.
*G06F 11/10* (2006.01)
*G06F 11/22* (2006.01)
*G06F 11/27* (2006.01)
*G06F 11/07* (2006.01)

(52) U.S. Cl.
CPC ...... *G06F 11/1068* (2013.01); *G06F 11/0793* (2013.01); *G06F 11/2268* (2013.01); *G06F 11/27* (2013.01)

(58) Field of Classification Search
None
See application file for complete search history.

(56) References Cited

U.S. PATENT DOCUMENTS 9,122,588 B1 * 9/2015 Mondal .................. G06F 3/06
9,189,442 B1 * 11/2015 Smith .................. G06F 9/44557
11,204,833 B1 * 12/2021 Rozen .................. G06F 11/076
11,556,263 B2 * 1/2023 Xiao .................. G06F 12/0246
2010/0306451 A1 12/2010 Johnson
(Continued)

FOREIGN PATENT DOCUMENTS

WO 2021048615 A1 3/2021

OTHER PUBLICATIONS

C. Sun, et al. "Design guidelines of storage class memory/flash hybrid solid-state drive considering system architecture, algorithm and workload characteristic," in IEEE Transactions on Consumer Electronics, vol. 62, No. 3, pp. 267-274, Aug. 2016, doi: 10.1109/TCE.2016.7613193. (Year: 2016).*

(Continued)

*Primary Examiner* — Daniel F. McMahon
(74) *Attorney, Agent, or Firm* — Joseph Mencher

(57) ABSTRACT

A storage device reclassification system includes a storage device reclassification subsystem coupled to a storage device that has a NAND storage subsystem and that is configured to perform first storage operations associated with a first storage device classification. The storage device reclassification subsystem performs testing operations on the NAND storage subsystem and, based on the testing operations, identifies at least one reduced capability of the NAND storage subsystem. Based on the at least one reduced capability of the NAND storage subsystem, the storage device reclassification subsystem determines at least one storage device operation modification and performs the at least one storage device operation modification on the storage device in order to configure the storage device to perform second storage operations that are different than the first storage operations and that are associated with a second storage device classification that is different than the first storage device classification.

20 Claims, 14 Drawing Sheets

(56) References Cited

U.S. PATENT DOCUMENTS

| | | | |
|---|---|---|---|
| 2016/0179406 A1 | 6/2016 | Gorobets et al. | |
| 2016/0342345 A1 | 11/2016 | Kankani et al. | |
| 2016/0342494 A1 | 11/2016 | Yang et al. | |
| 2018/0090213 A1 | 3/2018 | Peterson et al. | |
| 2020/0241765 A1 | 7/2020 | Yang et al. | |
| 2021/0026781 A1* | 1/2021 | Dong | G06F 12/0246 |
| 2021/0096780 A1* | 4/2021 | Kotzur | G06F 3/0619 |
| 2021/0096953 A1* | 4/2021 | Kotzur | H03M 13/3761 |
| 2021/0271549 A1* | 9/2021 | Khayat | G11C 29/20 |
| 2021/0311663 A1* | 10/2021 | Kotzur | G06F 3/0689 |
| 2022/0050858 A1* | 2/2022 | Karr | G06F 16/1748 |
| 2022/0147365 A1* | 5/2022 | Bernat | G06F 11/1076 |
| 2022/0156087 A1* | 5/2022 | Karr | G06F 9/4401 |
| 2022/0221997 A1* | 7/2022 | Navon | G06F 3/0673 |

OTHER PUBLICATIONS

International Search Report and Written Opinion mailed in International Application No. PCT/US2023/061127 dated May 4, 2023, 12 pages.

* cited by examiner

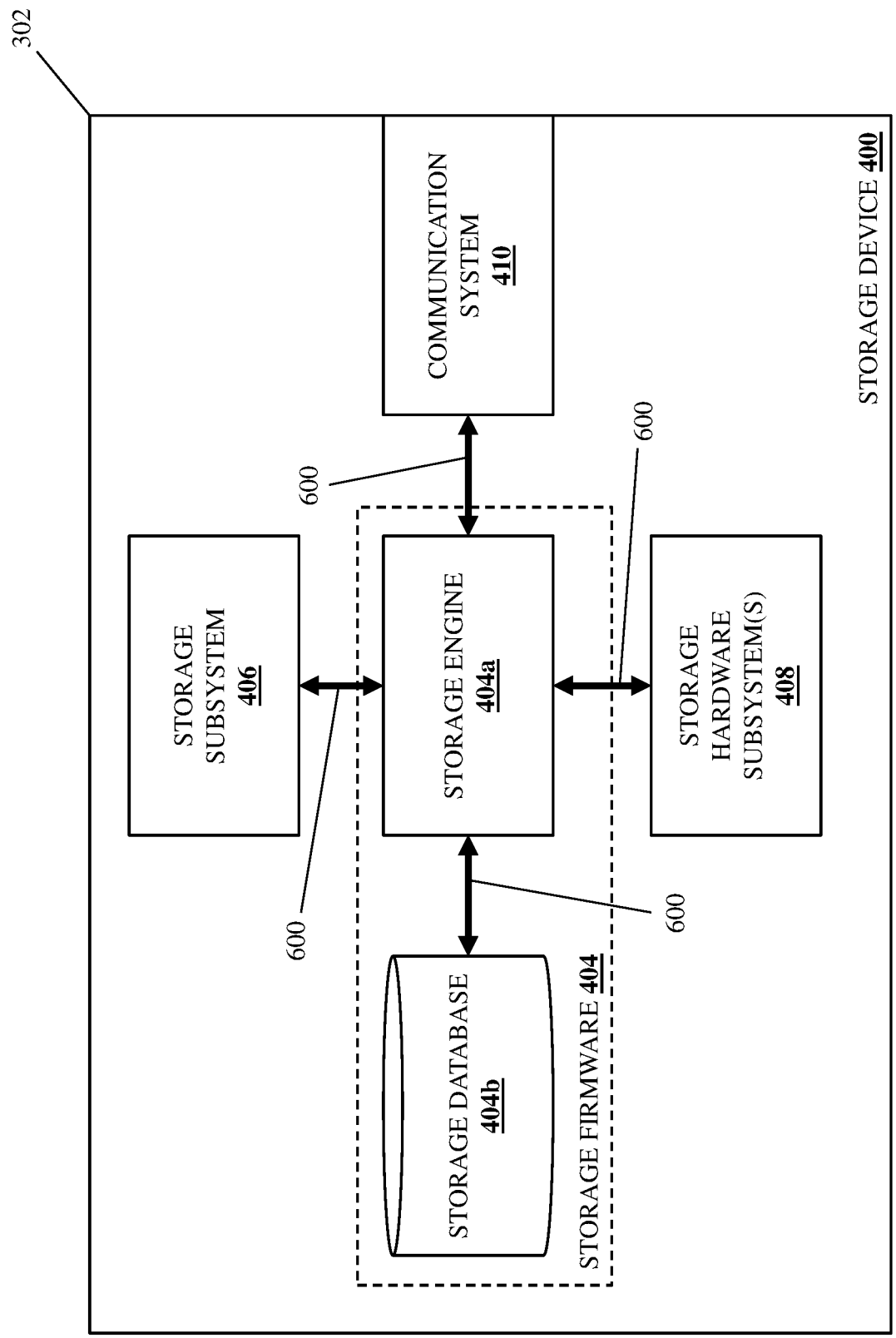

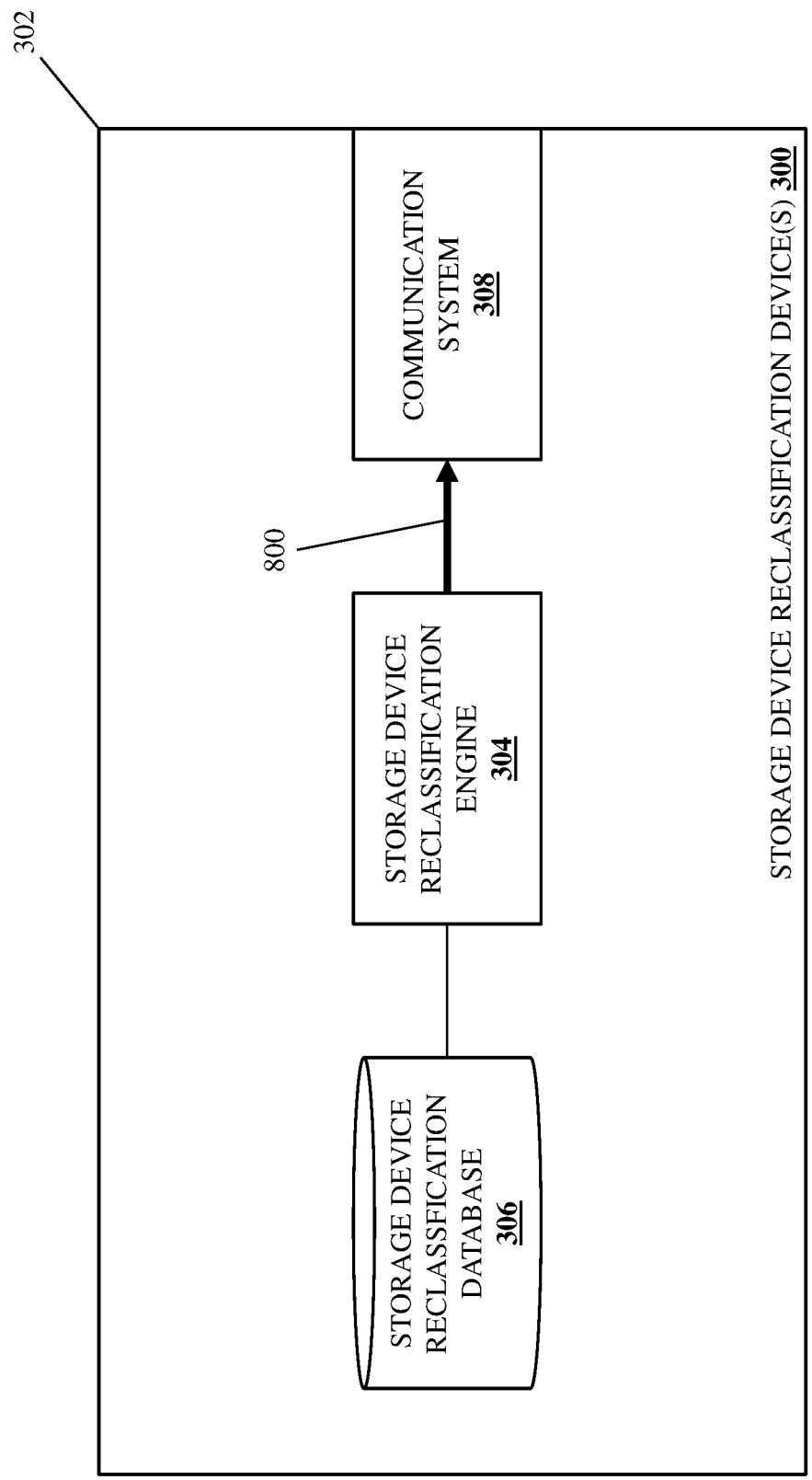

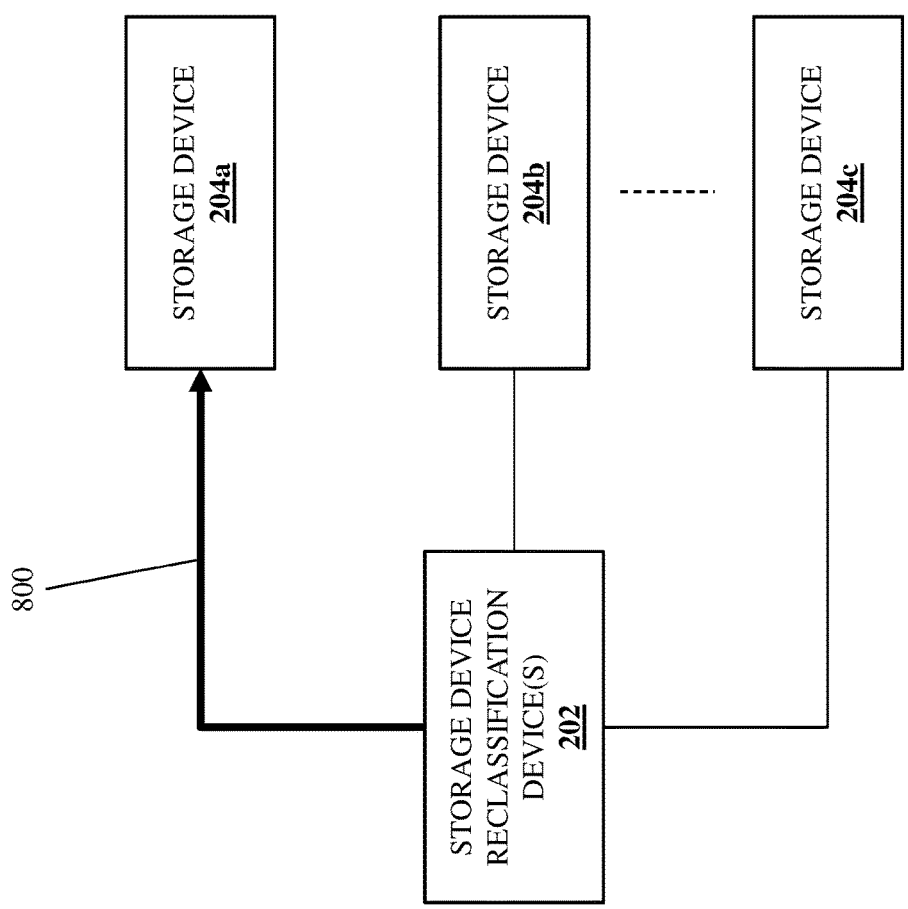

| TEST RESULT | | | STORAGE DEVICE OPERATION MODIFICATION | OUTCOME |
|---|---|---|---|---|
| P/E CYCLE MARGIN TO END OF LIFE | GOOD NAND BLOCK/NAND DIE COUNT | FLIPPED BIT CORRECTION BEHAVIOR | | |
| GOOD | GOOD | GOOD | NONE | DRIVE RECERTIFIED TO ORIGINAL SPECIFICATION AT XX% OF ORIGINAL LIFE |
| GOOD | MARGINAL | GOOD | STORAGE CAPACITY ADJUSTMENT | DRIVE RECERTIFIED TO ORIGINAL SPECIFICATION AT XX% OF ORIGINAL LIFE, WITH CAPACITY REDUCED TO ACCOMMODATE NAND BLOCKS |
| GOOD | BAD | GOOD | CODING ADJUSTMENT, STORAGE FIRMWARE ADJUSTMENT (TLC TO MLC) | DRIVE RECERTIFIED TO ORIGINAL SPECIFICATIONS AT XX% OF ORIGINAL LIFE, WITH CAPACITY REDUCED TO ACCOMMODATE CODING CHANGE |
| BAD | GOOD | GOOD | ALLOW DRIVE TO EXCEED PREVIOUSLY ESTABLISHED P/E CYCLE LIMIT, PERFORM EOL FIRMWARE TREATMENTS | DRIVE RECERTIFIED TO ORIGINAL SPECIFICATIONS AT XX% (AND BEYOND) OF ORIGINAL LIFE |
| BAD | GOOD | GOOD | NONE | DRIVE RECERTIFIED TO SIGNIFICANTLY REDCUED DPWD CAPABLILITIES TO CONSERVE FUTURE P/E CYCLES |
| BAD | GOOD | GOOD | | |

| | TEST RESULT | | STORAGE DEVICE OPERATION MODIFICATION | OUTCOME |
|---|---|---|---|---|
| P/E CYCLE MARGIN TO END OF LIFE | GOOD NAND BLOCK/NAND DIE COUNT | FLIPPED BIT CORRECTION BEHAVIOR | | |
| | | | TUNE FIRMWARE BASED ON TEST RESULTS TO IMPROVE FBC (E.G., VTS, ADDITIONAL RETRY STEPS, LLRS, FINER SAR TREATMENT) | DRIVE RECERTIFIED TO ORIGINAL SPECIFICATIONS AT XX% OF ORIGINAL LIFE, WITH LATENCY REDUCTION OF YY% TO ACCOMMODATE INCREASED ERROR HANDLING |
| GOOD | GOOD | BAD | PERFORM MORE AGGRESSIVE RAID STRIPING OR CODE WORD PARITY TO IMPROVE ECC CAPABILITY | DRIVE RECERTIFIED TO ORIGINAL SPECIFICATION AT XX% OF ORIGINAL LIFE, WITH LATENCY REDUCTION OF YY% TO ACCOMMODATE INNCREASED ERROR HANDLING, AND ZZ% REDUCTION IN CAPACITY FOR RAID/PARITY OVERHEAD CHANGE |
| | | | REDUCE DR SPECIFICATION | DRIVE RECERTIFIED TO ORIGINAL SPECIFICATIONS AT XX% OF ORIGINAL LIFE, WITH REDUCED DATA RETENTION CAPABILITIES CLAIMED |
| | BAD | BAD | RECERTIFY DRIVE TO LOWER UBER LEVEL | DRIVE RECERTIFIED TO REDUCED SPECIFICATIONS AT XX% OF ORIGINAL LIFE, UBER CPABILITIES SIGNIFICANTLY REDUCED |
| BAD | | | REDUCE REQUIREMENTS OVERALL | DRIVE RECERTIFIED TO SIGNIFICANTLY REDCUED SPECIFICATIONS |

STORAGE DEVICE RECLASSIFICATION SYSTEM

BACKGROUND

The present disclosure relates generally to information handling systems, and more particularly to reclassifying storage devices used with information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, storage systems, desktop computing devices, laptop/notebook computing devices, and/or other computing devices known in the art, utilize storage devices for the storage of data. For example, computing devices may include Solid-State Drive (SSD) storage devices that utilize NAND storage subsystem having NAND dies including NAND blocks that are made up of NAND cells that store the data discussed above. Furthermore, some SSD storage devices may be classified as "enterprise" SSD storage devices that offer relatively high reliability, availability, and scalability, and may be disposed of and replaced at predetermined/set calendar intervals prior to their reaching their suggested/targeted lifetime (e.g., a time period or usage level of the "enterprise" SSD storage device after which the "enterprise" SSD storage device may no longer meet its original datasheet specifications during its operation). However, the disposal and replacement of "enterprise" SSD storage devices as discussed above presents issues, as doing so contributes to electronic waste ("E-waste") that many users desire to reduce.

Accordingly, it would be desirable to provide a storage device reclassification system in order to address the issues discussed above.

SUMMARY

According to one embodiment, an Information Handling System (IHS) includes a processing system; and a memory system that is coupled to the processing system and that includes instructions that, when executed by the processing system, cause the processing system to provide a storage device reclassification engine that is configured to: perform testing operations on a NAND storage subsystem in a storage device that is configured to perform first storage operations associated with a first storage device classification; identify, based on the testing operations, at least one reduced capability of the NAND storage subsystem; determine, based on the at least one reduced capability of the NAND storage subsystem, at least one storage device operation modification; and perform the at least one storage device operation modification on the storage device in order to configure the storage device to perform second storage operations that are different than the first storage operations and that are associated with a second storage device classification that is different than the first storage device classification.

BRIEF DESCRIPTION OF THE DRAWINGS

FIG. 6C is a schematic view illustrating an embodiment of the storage device of FIG. 4 operating during the method of FIG. 5.

FIG. 8A is a schematic view illustrating an embodiment of the storage device reclassification device(s) of FIG. 3 operating during the method of FIG. 5.

FIG. 8B is a schematic view illustrating an embodiment of the storage device reclassification system of FIG. 2 operating during the method of FIG. 5.

FIG. 9A is a table view illustrating an embodiment of a portion of a table that describes the storage device reclassification performed during the method of FIG. 5 in a plurality of different scenarios.

FIG. 9B is a table view illustrating an embodiment of a portion of the table of FIG. 9A that describes the storage device reclassification performed during the method of FIG. 5 in a plurality of different scenarios.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
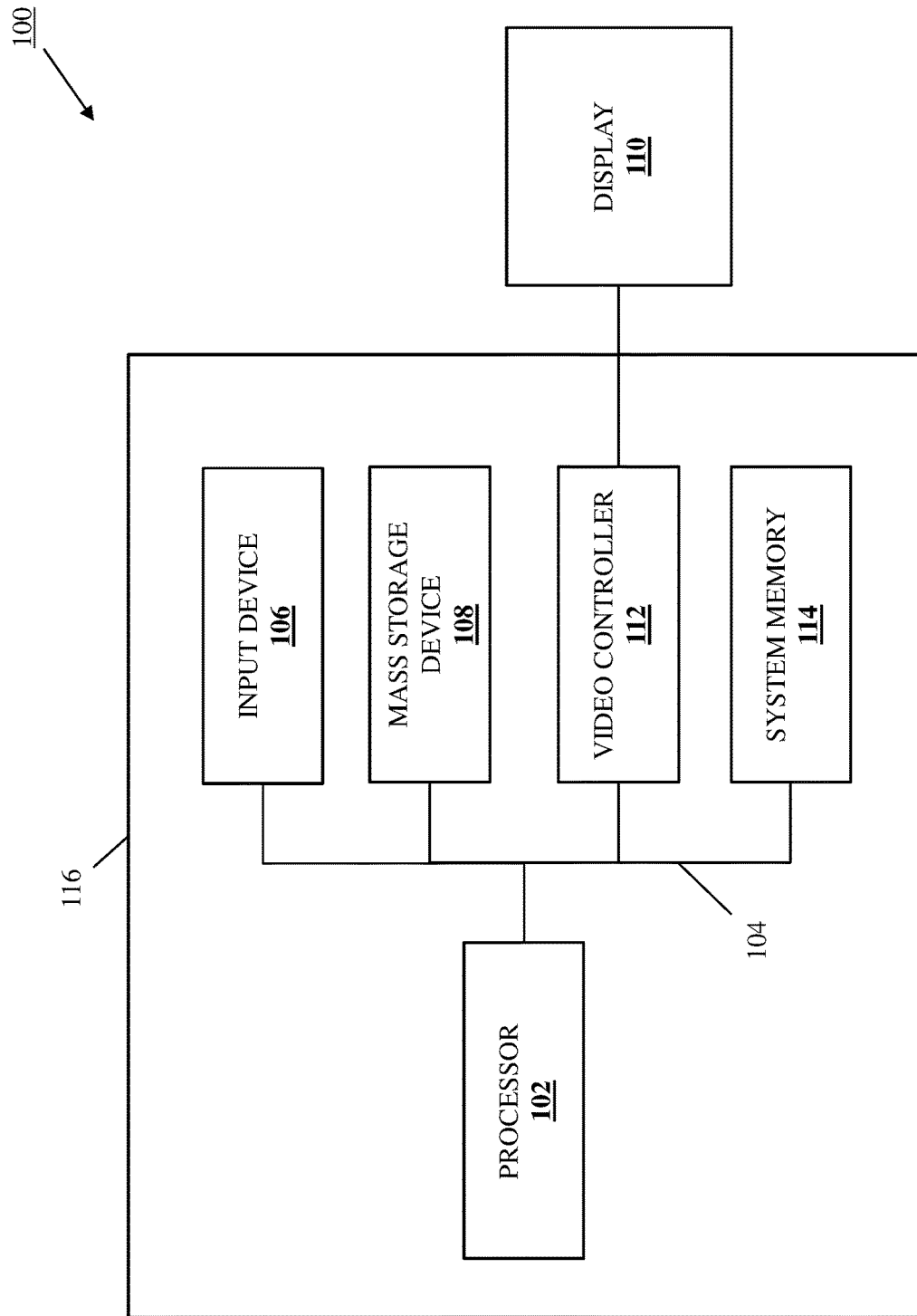
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
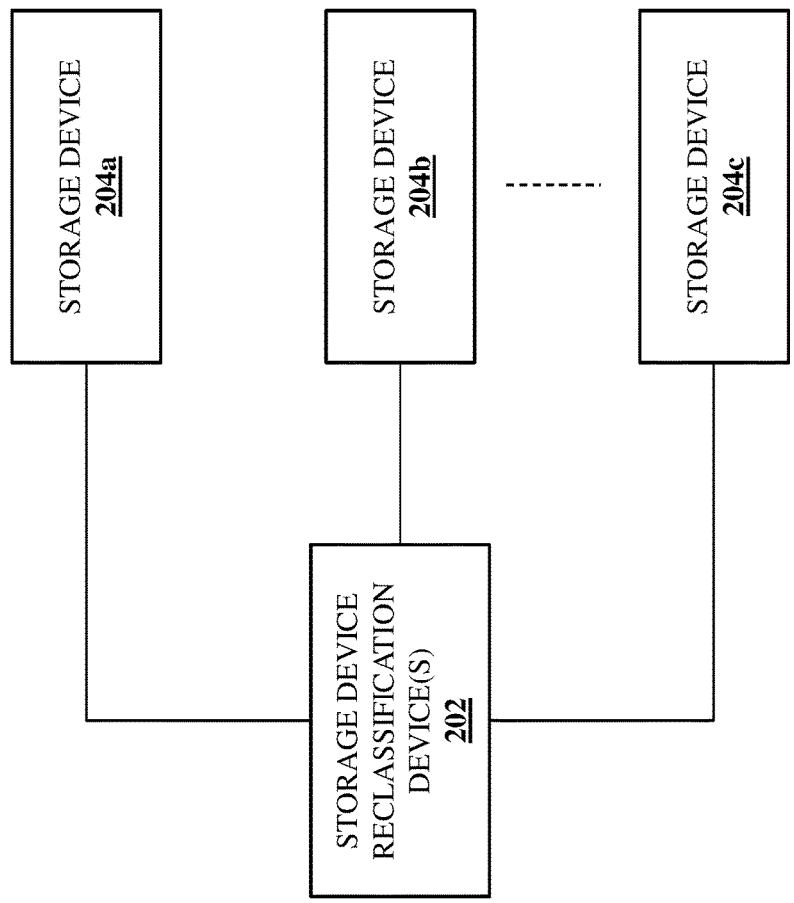
FIG. 2 is a schematic view illustrating an embodiment of a storage device reclassification system provided according to the teachings of the present disclosure.

Referring now to FIG. 2, an embodiment of a storage device reclassification system 200 is illustrated. In the illustrated embodiment, the storage device reclassification system 200 includes one or more storage device reclassification device(s) 202 coupled to a plurality of storage devices 204a, 204b, and up to 204c. In an embodiment, any or each of the storage device reclassification device(s) 202 may be provided by the IHS 100 discussed above with reference to FIG. 1, and/or may include some or all of the components of the IHS 100. In some examples, the storage device reclassification device(s) 202 may include a "user" computing device in which any of the storage devices 204a-204c were previously utilized while configured to perform first storage operations associated with a first storage device classification, discussed below. As such, storage devices utilized in computing systems controlled by users may be reclassified by providing software on those computing devices that enables the storage device reclassification operations discussed in further detail below. In other examples, the storage device reclassification device(s) 202 may include a "dedicated storage device reclassification" computing device in which any of the storage devices 204a-204c may be provided after having previously been utilized while configured to perform first storage operations associated with a first storage device classification, discussed below. As such, a user may purchase a computing device that is dedicated to perform the storage device reclassification operations discussed in further detail below, and any storage device needing reclassification may be coupled to that computing device.

In other examples, the storage device reclassification device(s) 202 may include "network-accessible storage device reclassification" computing device(s) to which any of the storage devices 204a-204c may be coupled to via a network after having previously been utilized while configured to perform first storage operations associated with a first storage device classification, discussed below. As such, a user may connect a computing device that includes a storage device needing reclassification to the "network-accessible storage device reclassification" computing device(s) via a network. In yet other examples, the storage device reclassification device(s) 202 may be provided at a computing device/storage device manufacturer/vendor location, and users may provide any of the storage devices 204a-204c to the computing device/storage device manufacturer/vendor location after those storage devices have previously been utilized while configured to perform first storage operations associated with a first storage device classification, discussed below. As such, a computing device/storage device manufacturer/vendor may provide a storage device reclassification service for storage devices received from users using the at least one storage device reclassification device(s) 202. However, while several examples of different implementations of the storage device reclassification system 200 have been described, one of skill in the art in possession of the present disclosure will recognize that the storage device reclassification techniques described herein may be implemented in a variety of other manners that will fall within the scope of the present disclosure as well.

Figure 3:
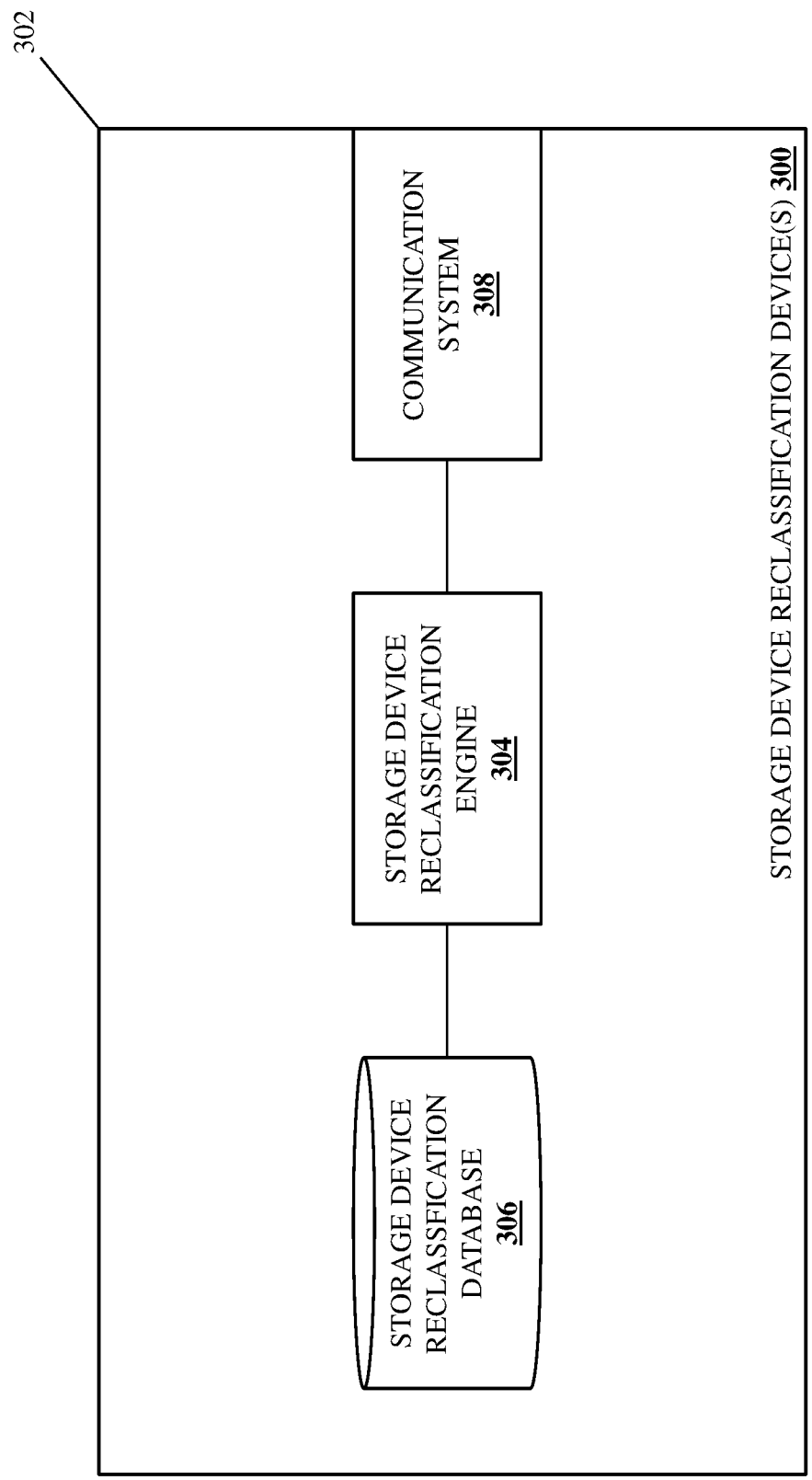
FIG. 3 is a schematic view illustrating an embodiment of storage device reclassification device(s) that may be included in the storage device reclassification system of FIG. 2.

Referring now to FIG. 3, an embodiment of one or more storage device reclassification device(s) 300 is illustrated that may provide the storage device reclassification device(s) 202 discussed above with reference to FIG. 2. As such, the storage device reclassification device(s) 300 may be provided by the IHS 100 discussed above with reference to FIG. 1 and/or may include some or all of the components of the IHS 100, and in different examples may be implemented as the "user" computing device, the "dedicated storage device reclassification" computing device, the "network-accessible storage device reclassification" computing device(s), and/or at the computing device/storage device manufacturer/vendor location as discussed above. However, while illustrated and discussed in particular implementations, one of skill in the art in possession of the present disclosure will recognize that the functionality of the storage device reclassification device(s) 300 discussed below may be provided by other devices that are configured to operate similarly as the storage device reclassification device(s) discussed below.

In the illustrated embodiment, the storage device reclassification device(s) 300 include at least one chassis 302 that houses the components of the storage device reclassification device(s) 300, only some of which are illustrated and discussed below. For example, the at least one chassis 302 may house a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to provide a storage device reclassification engine 304 that is configured to perform the functionality of the storage device reclassification engines and/or storage device reclassification devices discussed below.

The chassis 302 may also house a storage system (not illustrated, but which may include the storage 108 discussed above with reference to FIG. 1) that is coupled to the storage device reclassification engine 304 (e.g., via a coupling between the storage system and the processing system) and that includes a storage device reclassification database 306 that is configured to store any of the information utilized by the storage device reclassification engine 304 discussed below. The chassis 302 may also house a communication system 308 that is coupled to the storage device reclassification engine 304 (e.g., via a coupling between the communication system 308 and the processing system) and that may be provided by any of a variety of storage device coupling and communication components that one of skill in the art in possession of the present disclosure would recognize as allowing the storage device reclassification device(s) 300 to couple to the storage devices as described herein. However, while specific storage device reclassification device(s) 300 have been illustrated, one of skill in the art in possession of the present disclosure will recognize that storage device reclassification device(s) (or other devices operating according to the teachings of the present disclosure in a manner similar to that described below for the storage device reclassification device(s) 300) may include a variety of components and/or component configurations for providing conventional functionality, as well as the functionality discussed below, while remaining within the scope of the present disclosure as well.

Figure 4:
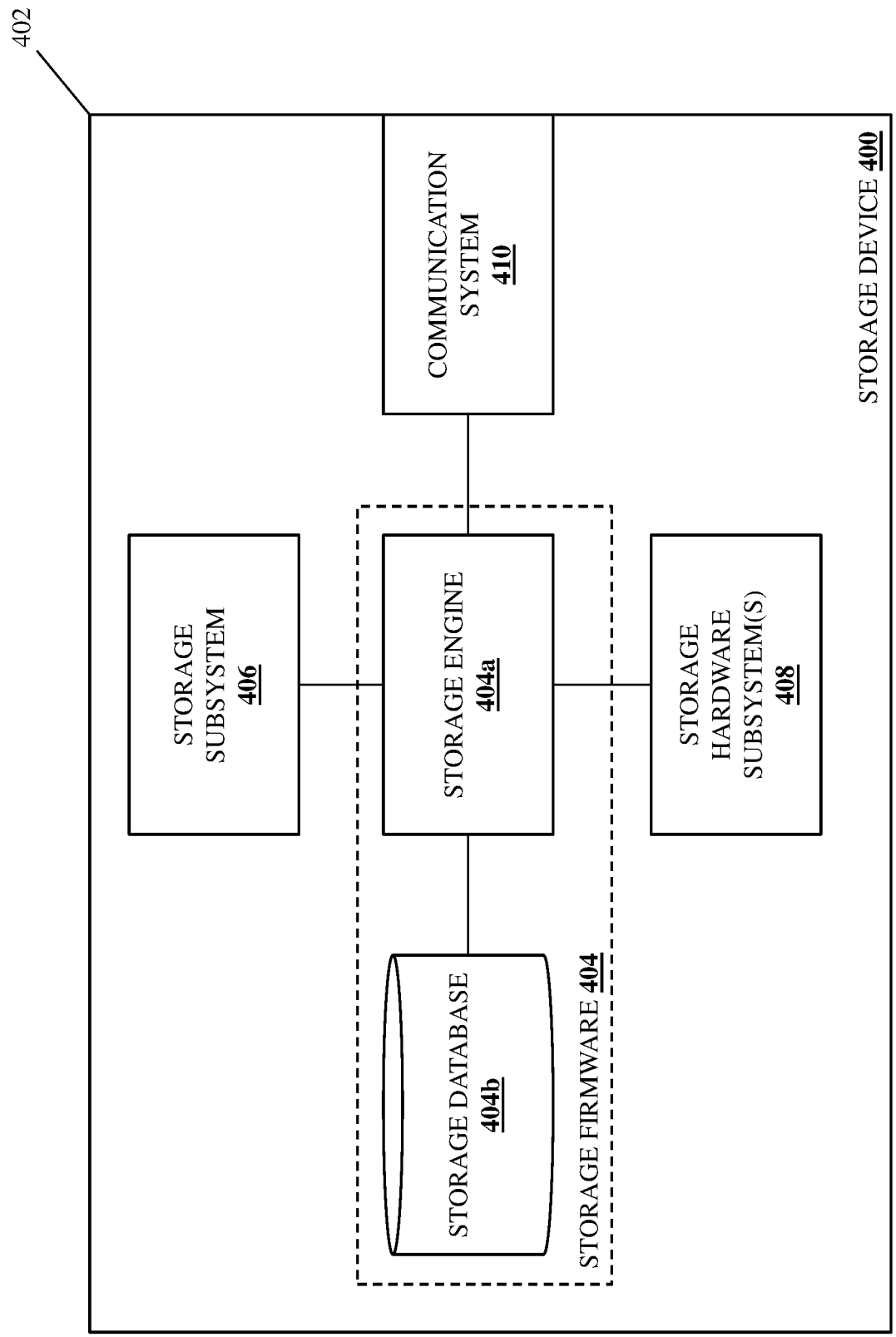
FIG. 4 is a schematic view illustrating an embodiment of a storage device that may be included in the storage device reclassification system of FIG. 2.

Referring now to FIG. 4, an embodiment of a storage device 400 is illustrated that may provide any of the storage devices 204a-204c discussed above with reference to FIG. 2. In an embodiment, the storage device 400 may be provided in the IHS 100 discussed above with reference to FIG. 1 (e.g., as the storage device 108 discussed above with reference to FIG. 1), and in the specific examples below is described as being provided by a Solid-State Drive (SSD) storage device. However, while illustrated and discussed as being provided by an SSD storage device, one of skill in the art in possession of the present disclosure will recognize that the functionality of the storage device 400 discussed below may be provided by other devices (e.g., Hard Disk Drive (HDD) storage devices) that are configured to operate similarly as the storage device 400 discussed below.

In the illustrated embodiment, the storage device 400 includes a chassis 402 that houses the components of the storage device 400, only some of which are illustrated and discussed below. For example, the chassis 402 may house a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to provide storage firmware 404 that includes a storage engine 404a that is configured to perform the functionality of the storage engines, storage firmware, and/or storage devices discussed below. Furthermore, the storage firmware 404 may also include a storage database 404b that is configured to store any of the information utilized by the storage engine 404a discussed below.

The chassis 402 may also house a storage subsystem 406 that is coupled to the storage engine 404a (e.g., via a coupling between the storage subsystem 406 and the processing system that provides the storage firmware 404) and that, in the specific examples provided below, is provided by a NAND storage subsystem including NAND dies having NAND blocks that are made up of NAND cells that store data during operation of the storage device 400 as part of runtime operations of a computing device (e.g., the IHS 100 discussed above with reference to FIG. 1) in which they are utilized. The chassis 402 may also house one or more storage hardware subsystem(s) 408 that may be coupled to the storage engine 404a (e.g., via a coupling between the storage hardware subsystem(s) 408 and the processing system that provides the storage firmware 404) and that may be provided by Power Loss Prevention (PLP) capacitors, controllers, communication components, Random Access Memory (RAM) devices (e.g., for cache and computer operations), power delivery components, power conversion components, power measurement circuitry, temperature sensors, and/or other storage hardware subsystems that would be apparent to one of skill in the art in possession of the present disclosure.

The chassis 402 may also house a communication system 410 that is coupled to the storage engine 404 (e.g., via a coupling between the communication system 410 and the processing system that provides the storage firmware 404) and that may be provided by any of a variety of storage device communication components that one of skill in the art in possession of the present disclosure would recognize as allowing the coupling of the storage device 400 to the storage device reclassification device(s) discussed herein. However, while a specific storage device 400 has been illustrated and described, one of skill in the art in possession of the present disclosure will recognize that storage devices (or other devices operating according to the teachings of the present disclosure in a manner similar to that described below for the storage device 400) may include a variety of components and/or component configurations for providing conventional storage device functionality, as well as the functionality discussed below, while remaining within the scope of the present disclosure as well.

Figure 5:
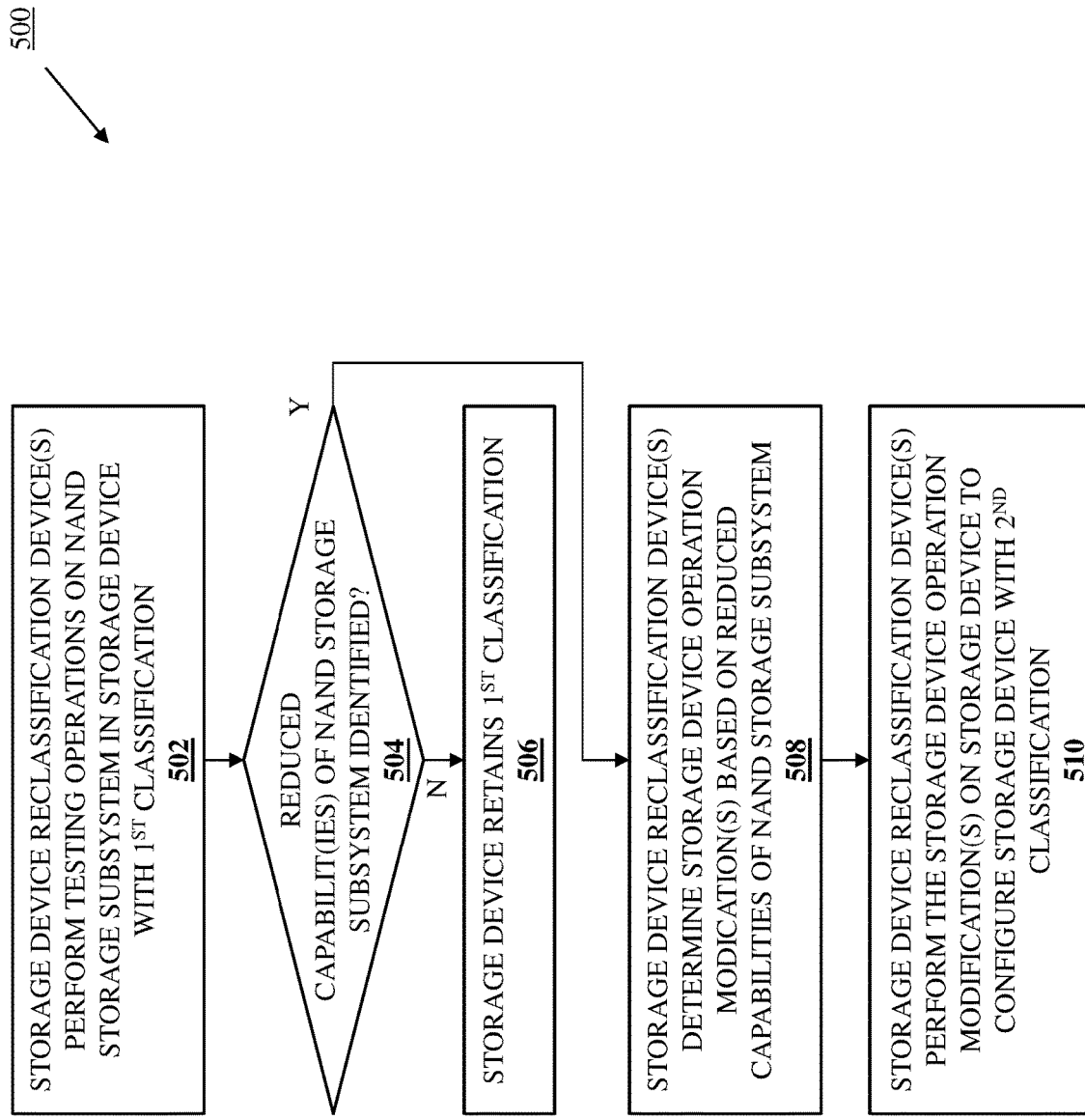
FIG. 5 is a flow chart illustrating an embodiment of a method for reclassifying storage devices.

Referring now to FIG. 5, an embodiment of a method 500 for reclassifying storage devices is illustrated. As discussed below, the systems and methods of the present disclosure provide for the modification of the operation of storage devices in order to reclassify those storages devices when testing operations determine that the NAND storage subsystem in those storage devices has reduced capabilit(ies). For example, the storage device reclassification system of the present disclosure may include a storage device reclassification subsystem coupled to a storage device that has a NAND storage subsystem and that is configured to perform first storage operations associated with a first storage device classification. The storage device reclassification subsystem performs testing operations on the NAND storage subsystem and, based on the testing operations, identifies at least one reduced capability of the NAND storage subsystem. Based on the at least one reduced capability of the NAND storage subsystem, the storage device reclassification subsystem determines at least one storage device operation modification and performs the at least one storage device operation modification on the storage device in order to configure the storage device to perform second storage operations that are different than the first storage operations and that are associated with a second storage device classification that is different than the first storage device classification. As such, storage devices with NAND storage subsystems having reduced capabilities due to, for example, previous use of those storage devices, may be reconfigured to perform modified storage operations in order to reclassify those storage devices for use in reduced-storage-requirement scenarios.

The method 500 begins at block 502 where storage device reclassification device(s) perform testing operations on a NAND storage subsystem in a storage device with a first classification. As discussed above, the storage device reclassification operations described herein may be performed in a variety of manners. For example, software that enables the storage device reclassification operations discussed below may be provided on a "user" computing device in which a storage device was previously utilized while configured to perform first storage operations associated with a first storage device classification, and a user of that "user" computing device may control the storage device reclassification of that storage device via the "user" computing device in which that storage device is utilized. In another example, a "dedicated storage device reclassification" computing device may be provided, and a storage device that was previously utilized while configured to perform first storage operations associated with a first storage device classification may be coupled to that "dedicated storage device reclassification" computing device, allowing a user to remove a storage device from any other computing device and couple it to the "dedicated storage device reclassification" computing device to control the storage device reclassification of that storage device.

In yet other examples, "network-accessible storage device reclassification" computing device(s) may be provided, and a storage device that was previously utilized while configured to perform first storage operations associated with a first storage device classification may be coupled to the "network-accessible storage device reclassification" computing device(s) via a network (i.e., via the connection of a computing device that includes that storage device to the network) to control the storage device reclassification of that storage device. In yet another example, a computing device/storage device manufacturer/vendor location may include storage device reclassification device(s) 202, and a user may provide a storage device to the computing device/storage device manufacturer/vendor location after those storage devices have previously been utilized while configured to perform first storage operations associated with a first storage device classification, with a computing device/storage device manufacturer/vendor controlling the storage device reclassification of that storage device. However, while several examples of the performance of the storage device reclassification operations have been described, one of skill in the art in possession of the present disclosure will recognize that the storage device reclassification operations described herein may be performed in a variety of manners that will fall within the scope of the present disclosure as well.

In the examples provided below, the storage device reclassification operations are described as being performed on the storage device 204a that was previously utilized while configured to perform first storage operations associated with a first storage device classification, with the first storage device classification provided by an "enterprise" SSD storage device classification that may have been defined by the storage device manufacturer/vendor via "original" datasheet requirements that the storage device was configured to satisfy during its operation. As will be appreciated by one of skill in the art in possession of the present disclosure, an "enterprise" SSD storage device classification may require a variety of storage device performance characteristics. For example, an "enterprise" classification for an SDD storage device may require relatively high-performance capabilities (e.g., high-performance write capabilities, high-performance read capabilities, sequential writes/reads, random writes/reads, etc.), relatively low latency capabilities (e.g., for data retrieval), relatively high endurance capabilities (e.g., 1 Drive Write Per Day (DWPD), which equates to full storage device capacity write and erase per day of operation for ~5 years), relatively high powered-off recovery capabilities (e.g., maintaining the storage of data for 3 months at 40 degrees Celsius), relatively low allowable bit error rates (e.g., bit error rates at the level of approximately $1e10^{-17}$), relatively wide ranges of allowable operating temperatures (e.g., between 0 Celsius and 70 Celsius), data security features, data encoding features, data sanitization features, and/or other "enterprise" capabilities that would be apparent to one of skill in the art in possession of the present disclosure.

However, one of skill in the art in possession of the present disclosure will appreciate how the storage device reclassification operations described herein may be performed on multiple storage devices (e.g., the storage devices 204b and up to 204c) and/or storage devices with different storage device classifications while remaining within the scope of the present disclosure as well. For example, the storage device reclassification operations described herein may be performed on a group of storage devices (e.g., Redundant Array of Independent Disk (RAID) storage devices) in order to reclassify at least some of the storage devices in that group for further use (e.g., further use in a RAID system, but possibly with reduced capabilities). Furthermore, while a plurality of storage devices 204a-204c are illustrated and described as being coupled to the storage device reclassification device(s) 202, one of skill in the art in possession of the present disclosure will appreciate how only a single storage device may be coupled to the storage device reclassification device(s) 202 for reclassification while remaining within the scope of the present disclosure as well.

Figure 6A:
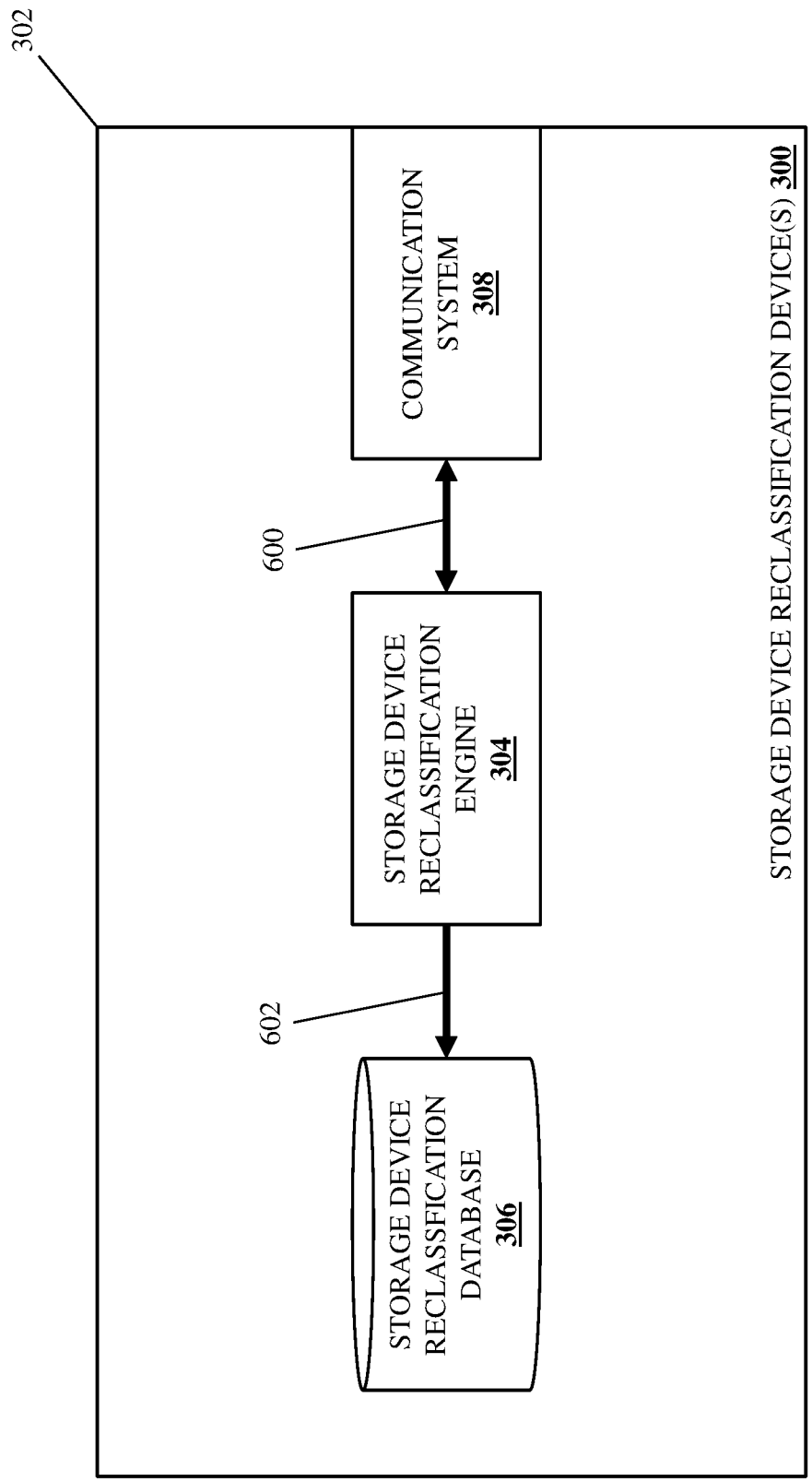
FIG. 6A is a schematic view illustrating an embodiment of the storage device reclassification device(s) of FIG. 3 operating during the method of FIG. 5.
Figure 6B:
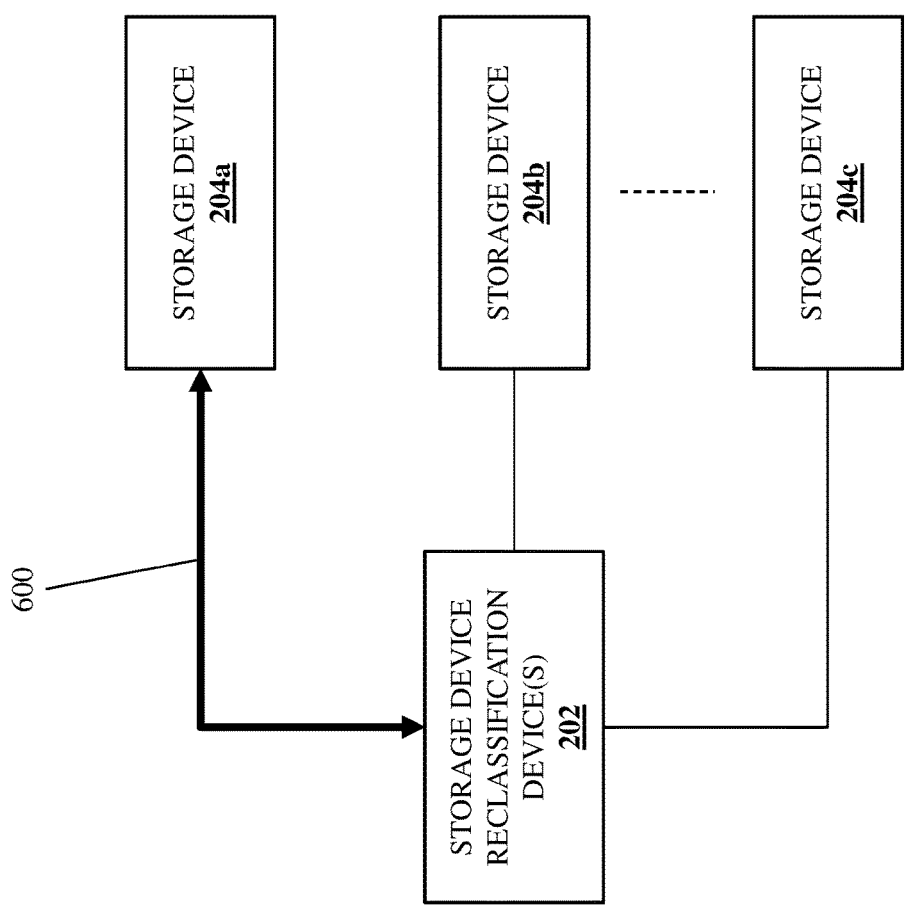
FIG. 6B is a schematic view illustrating an embodiment of the storage device reclassification system of FIG. 2 operating during the method of FIG. 5.

With reference to FIGS. 6A, 6B, and 6C, in an embodiment of block 502, the storage device reclassification engine 304 in the storage device reclassification device(s) 202/300 may perform testing operations 600 on the storage device 204a/400 (via their respective communication systems 308 and 410) that are illustrated in FIG. 6C as causing the storage engine 404a to execute testing commands/instructions on the storage database 404b, the storage subsystem 406, the storage hardware subsystems 408, as well as any other storage device component that would be apparent to one of skill in the art in possession of the present disclosure, and then providing testing results back to the storage device reclassification engine 304 so that the storage device reclassification engine 304 may perform testing result storage operations 602 that may include storing those testing results in the storage device reclassification database 306. As will be appreciated by one of skill in the art in possession of the present disclosure, some testing operations (e.g., temperature-based testing operations) may include the utilization of other systems (e.g., a temperature-controlled system that allows the temperature environment of the storage device to be adjusted), and thus those systems will fall within the scope of the present disclosure as well. However, while the testing operations 600 are illustrated and described as being performed via the execution of testing commands/instructions by the storage engine 404a in the storage firmware 404, one of skill in the art in possession of the present disclosure will appreciate how some of the testing operations performed by the storage device reclassification engine 304 on the storage device 204a/400 may be performed without the assistance of the storage engine 404a/storage firmware 404 and/or using other subsystems in the storage device 204a/400 while remaining within the scope of the present disclosure as well.

In an embodiment, the testing operations 600 performed by the storage device reclassification engine 304 on the storage device 204a/400 may include log analysis testing operations. For example, log analysis testing operations may include accessing a log in the storage device 204a/400 and performing an analysis of any or all of the data that the storage device 204a/400 has logged throughout its lifetime. The log analysis testing operations may result in log analysis testing results such as storage subsystem program/erase (P/E) cycle information that may include a uniformity of P/E cycle count per NAND block in the storage subsystem 406, a total P/E cycle count per NAND block in the storage subsystem 406, and/or other storage subsystem P/E cycle information known in the art; storage subsystem failure information such as program operation failures associated with NAND die in the storage subsystem 406, erase operation failures associated with a NAND die in the storage subsystem 406, NAND die failures associated with NAND die in the storage subsystem 406, NAND plane failures associated with the storage subsystem 406, and/or other storage subsystem failure information known in the art; storage subsystem error information such as a number of NAND blocks in any particular physical domain (e.g., a NAND die domain, a NAND plane domain, a NAND package domain, etc.) associated with the storage subsystem 406 that were retired due to high error rates, error recovery rate statistics associated with the storage subsystem 406, and/or other storage subsystem error information known in the art; operating temperatures associated with the storage subsystem 406 (or other data that may be utilized, for example, to assess a relative "aggressiveness" of the usage of the storage subsystem); as well as any other log analysis information that would be apparent to one of skill in the art in possession of the present disclosure.

In another embodiment, the testing operations 600 performed by the storage device reclassification engine 304 on the storage device 204a/400 may include error testing operations. For example, error testing operations may include performing a "bit flipped count scan" in the storage device 204a/400 by performing a basic program/erase read of NAND pages in the storage subsystem 406. The error testing operations may result in error testing results such as storage subsystem error information that may include a "bit flipped" count (which one of skill in the art in possession of the present disclosure will recognize may be aggregated on a per-NAND-page basis, a per-NAND-plane basis, a per-NAND-die basis, a per-NAND-package basis, or using other storage subsystem aggregation techniques known in the art), and/or other storage subsystem error information known in the art.

To provide a specific example of the error testing operations discussed above, such error testing operations performed by the storage device reclassification engine 304 may include self-test operations in which any portion of the NAND storage subsystem 406 may be subject to a plurality of program and erase cycles, followed by a voltage scan using the techniques described herein, and one of skill in the art in possession of the present disclosure will recognize how such self-test operations should be successfully performed by all NAND pages. However, an outlier result from such self-test operations may include the identification of NAND pages that cannot be decoded (e.g., due to a relatively high Flipped Bit Count (FBC)), which may indicate "bad" NAND pages, or that a present control voltage configuration is not proper for that NAND page. Other outlier results from such self-test operations may include identifying NAND pages that exceed a particular threshold FBC, elevated FBCs in particular physical configurations (e.g., neighboring NAND wordlines) that may indicate impending NAND failures, and/or other outlier results that one of skill in the art in possession of the present disclosure would recognize as identifying possible issues to address in the storage subsystem 406. As will be appreciated by one of skill in the art in possession of the present disclosure, such outlier results may be investigated individually, or may be aggregated to a NAND plane/NAND die/NAND package level in order to, for example, possibly retire that NAND domain.

In another embodiment, the testing operations 600 performed by the storage device reclassification engine 304 on the storage device 204a/400 may include powered-on data retention testing operations. For example, powered-on data retention operations may include subjecting the storage device 204a/400 to a variety of powered-on data retention conditions and/or usage states that it may experience during its operations, and performing read scans, voltage scans, and/or other data retention testing operations that would be apparent to one of skill in the art in possession of the present disclosure. The powered-on data retention operations may result in powered-on data retention testing results such as storage subsystem powered-on data retention information that may include a "bit flipped" count (which one of skill in the art in possession of the present disclosure will recognize may be aggregated on a per-NAND-page basis, a per-NAND-plane basis, a per-NAND-die basis, a per-NAND-package basis, or using other storage subsystem aggregation techniques known in the art), NAND bit distribution data (e.g., resulting from a voltage search), and/or other storage subsystem powered-on data retention information known in the art. As will be appreciated by one of skill in the art in possession of the present disclosure, the powered-on data retention operations may identify outlier results that are similar to those described for the error testing operations discussed above.

In another embodiment, the testing operations 600 performed by the storage device reclassification engine 304 on the storage device 204a/400 may include powered-off data retention testing operations. For example, powered-off data retention operations may include subjecting the storage device 204a/400 to a variety of powered-off data retention conditions and/or usage states (e.g., accelerated powered-off data retention conditions and/or usage states) that it may experience during its operations (e.g., a powered-off recovery scenario, a relatively short-term powered-off time, a maximum powered-off time based on storage device specification limits, etc.), and performing read scans, voltage scans, and/or other data retention testing operations that would be apparent to one of skill in the art in possession of the present disclosure. The powered-off data retention operations may result in powered-off data retention testing results such as storage subsystem powered-off data retention information that may include a "bit flipped" count (which one of skill in the art in possession of the present disclosure will recognize may be aggregated on a per-NAND-page basis, a per-NAND-plane basis, a per-NAND-die basis, a per-NAND-package basis, or using other storage subsystem aggregation techniques known in the art), NAND bit distribution data (e.g., resulting from a voltage search), and/or other storage subsystem powered-off data retention information known in the art.

As will be appreciated by one of skill in the art in possession of the present disclosure, the powered-off data retention operations may differ from the error testing operations and data retention operations discussed above, as the powered-off data retention operations may be relatively more "extreme", particularly with regard to relatively large P/E cycle counts, the number of decode failures that are to-be expected, the error recovery operations that are required, and/or other powered-off data retention operations characteristics known in the art. Metrics identified from such powered-off data retention operations may include a level of read retry operations required for data recovery, a number of retry reads, a number of "soft"-decoding or other elevated ECC attempts, a number of XOR or RAID data recovery operations, and/or other powered-off data retention metrics that would be apparent to one of skill in the art in possession of the present disclosure. Such metrics may then be aggregated on the same NAND block/NAND plane/NAND die/NAND package level, and if a large number of retry operations are required for a particular NAND domain, that NAND domain may be a candidate for retirement.

In another embodiment, the testing operations 600 performed by the storage device reclassification engine 304 on the storage device 204a/400 may include hardware subsystem "self-test" testing operations. For example, hardware subsystem "self-test" testing operations may include performing non-invasive testing of the storage hardware subsystem(s) in the storage device 204a/400 such as PLP capacitors and/or other storage hardware subsystems that would be apparent to one of skill in the art in possession of the present disclosure. The hardware subsystem "self-test" testing operations may result in hardware subsystem "self-test" testing results such as storage subsystem hardware self-test information that may include an indication of whether any particular storage hardware subsystem 408 passed or failed a self-test, the results of a margin test, and/or other storage subsystem hardware self-test information known in the art. As will be appreciated by one of skill in the art in possession of the present disclosure, the PLP capacitors discussed above may degrade over time when subject to relatively high temperatures, and thus are likely candidates for such hardware subsystem "self-test" testing operations. However, other hardware subsystem testing operations may be performed such as, for example, the reporting of various power supply voltages to ensure they are within a desired range, the testing of NAND buses by writing data to and reading that data back from NAND volatile buffers (i.e., not committing those writes to NAND permanent storage) in order to check for bit errors, self-testing of DRAM devices to ensure they are working properly, and/or any other hardware subsystem testing operations that would be apparent to one of skill in the art in possession of the present disclosure.

While several specific examples of testing operations that may be performed in order to provide the storage device reclassification of the present disclosure have been described above, one of skill in the art in possession of the present disclosure will appreciate that those examples are not meant to limiting (e.g., to storage devices with NAND storage subsystems as in some of the examples above), and that any of a variety of testing operations that one of skill in the art in possession of the present disclosure would recognize as allowing the storage device reclassification described herein may be performed while remaining within the scope of the present disclosure as well.

Figure 7:
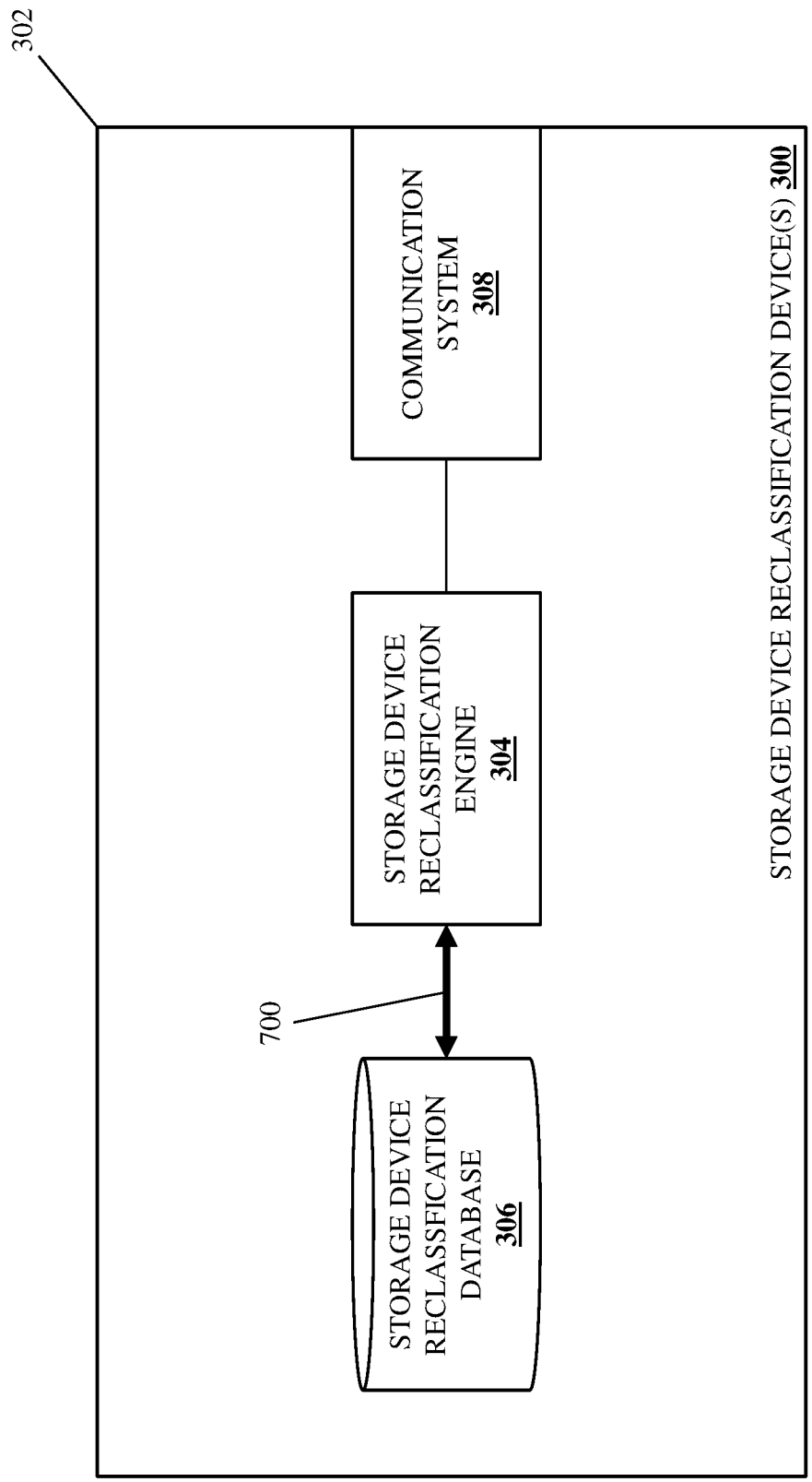
FIG. 7 is a schematic view illustrating an embodiment of the storage device reclassification device(s) of FIG. 3 operating during the method of FIG. 7.

The method 500 then proceeds to decision block 504 where it is determined whether reduced capabilit(ies) of a NAND storage subsystem are identified based on the testing operations. With reference to FIG. 7, in an embodiment of decision block 504, the storage device reclassification engine 304 in the storage device reclassification device(s) may perform NAND storage subsystem reduced capability identification operations 700 that may include accessing the testing results that were generated based on the testing operations performed at block 502 and stored in the storage device reclassification database 306, and determining whether those testing results indicate reduced capabilities of the storage subsystem 406 in the storage device 204a/400. As will be appreciated by one of skill in the art in possession of the present disclosure, the determination of whether testing results indicate reduced capabilities of the storage subsystem 406 may include retrieving a first test result identifying a test measurement of a first capability of the storage subsystem 406, comparing that first test result to a reference measurement of the first capability (e.g., as identified by the "original" datasheet requirement discussed above for the storage device 204a/400 or using other reference measurement identification techniques known in the art) that may be stored in the storage device reclassification database 306 or accessible via a network, and determining whether the difference between first test result/test measurement and the reference measurement indicates a reduction in the first capability of the storage subsystem 406. However, while a specific example has been provided, one of skill in the art in possession of the present disclosure will appreciate how other reduced capability determination techniques will fall within the scope of the present disclosure as well.

Continuing with the specific example of the log analysis testing operations/log analysis testing results discussed above, at decision block 504 the storage device reclassification engine 304 may determine whether the storage subsystem P/E cycle information is indicative of a reduced capability of the storage subsystem 406 (e.g., whether the uniformity of P/E cycle count per NAND block in the NAND storage subsystem 406 is indicative of a reduced capability of the storage subsystem 406, whether the total P/E cycle count per NAND block in the storage subsystem 406 is indicative of a reduced capability of the storage subsystem 406, etc.); whether the storage subsystem failure information indicates a reduced capability of the storage subsystem 406 (e.g., whether the program operation failures associated with NAND die in the storage subsystem 406 is indicative of a reduced capability of the storage subsystem 406, whether the erase operation failures associated with a NAND die in the storage subsystem 406 is indicative of a reduced capability of the storage subsystem 406, whether the NAND die failures associated with NAND die in the storage subsystem 406 is indicative of a reduced capability of the storage subsystem 406, whether the NAND plane failures associated with the storage subsystem 406 is indicative of a reduced capability of the storage subsystem 406, whether a number of NAND blocks in any particular physical domain (e.g., NAND die, NAND plane, NAND package, etc.) associated with the storage subsystem 406 that were retired due to high error rates is indicative of a reduced capability of the storage subsystem 406, whether the error recovery rate statistics associated with the storage subsystem 406 is indicative of a reduced capability of the storage subsystem 406, whether the operating temperatures associated with the storage subsystem 406 is indicative of a reduced capability of the storage subsystem 406, as well as whether any other log analysis information indicates a reduced capability of the storage subsystem 406.

Continuing with the specific example of the error testing operations/error testing results discussed above, at decision block 504 the storage device reclassification engine 304 may determine whether the storage subsystem error information is indicative of a reduced capability of the storage subsystem 406 (e.g.,, whether the "bit flipped" count is indicative of a reduced capability of the storage subsystem 406), whether any of the outlier results discussed above are indicative of a reduced capability of the storage subsystem 406, and/or whether any other storage subsystem error information indicates a reduced capability of the storage subsystem 406. Continuing with the specific example of the powered-on data retention testing operations/powered-on data retention testing results discussed above, at decision block 504 the storage device reclassification engine 304 may determine whether the storage subsystem powered-on data retention information is indicative of a reduced capability of the storage subsystem 406 (e.g., whether a "bit flipped" count is indicative of a reduced capability of the storage subsystem 406, whether NAND bit distribution data is indicative of a reduced capability of the storage subsystem 406, etc.), whether any of the outlier results discussed above are indicative of a reduced capability of the storage subsystem 406, and/or whether any other storage subsystem powered-on data retention information indicates a reduced capability of the storage subsystem 406.

Continuing with the specific example of the powered-off data retention testing operations/powered-off data retention testing results discussed above, at decision block 504 the storage device reclassification engine 304 may determine whether the storage subsystem powered-off data retention information is indicative of a reduced capability of the storage subsystem 406 (e.g., whether a "bit flipped" count is indicative of a reduced capability of the storage subsystem 406, whether NAND bit distribution data is indicative of a reduced capability of the storage subsystem 406, etc.), whether any of the powered-off data retention testing metrics discussed above are indicative of a reduced capability of the storage subsystem 406, and/or whether any other storage subsystem powered-off data retention information indicates a reduced capability of the storage subsystem 406.

Continuing with the specific example of the hardware subsystem "self-test" testing operations/hardware subsystem "self-test" testing results discussed above, at decision block 504 the storage device reclassification engine 304 may determine whether the storage subsystem hardware self-test information is indicative of a reduced capability of the storage subsystem 406 (e.g., whether an indication of whether any particular storage hardware subsystem 408 passed or failed a self-test is indicative of a reduced capability of the storage subsystem 406, whether the results of a margin test is indicative of a reduced capability of the storage subsystem 406, etc.) whether any other hardware self-test information discussed above is indicative of a reduced capability of the storage subsystem 406, and/or whether any other storage subsystem hardware self-test information indicates a reduced capability of the storage subsystem 406.

While several specific examples of NAND storage subsystem reduced capability identification operations that may be performed in order to provide the storage device reclassification of the present disclosure have been described above, one of skill in the art in possession of the present disclosure will appreciate that those examples are not meant to limiting (e.g., to storage devices with NAND storage subsystems as in some of the examples above), and that any of a variety of NAND storage subsystem reduced capability identification operations that one of skill in the art in possession of the present disclosure would recognize as allowing the storage device reclassification described herein may be performed while remaining within the scope of the present disclosure as well.

If, at decision block 504, it is determined that no reduced capabilit(ies) of the NAND storage subsystem were identified, the method 500 proceeds to block 506 where the storage device retains the first classification. In an embodiment, at block 506 and in response to determining that the testing results that were generated based on the testing operations performed at block 502 do not indicate reduced capabilities of the storage subsystem 406, the storage device 204a/400 may retain the first classification. Continuing with the specific example provided above, when no reduced capabilities are identified for the NAND storage subsystem 406 in the storage device 204a/400 that was previously classified as an "enterprise" SSD storage device, that storage device 204a/400 may retain that "enterprise" SSD storage device classification. As such, one result of the storage device reclassification operations described herein is to "do nothing" when, for example, testing operations performed on a storage device indicate that the storage device includes capabilities at (or in excess of) its current classification such that the storage device meets its original datasheet specifications (or the requirements of any current classification that may have been previously provided via the storage device reclassification operations described herein).

In some embodiments, the storage device reclassification engine 304 may be configured to convey storage device reclassification information to a user or other entity in control of the storage device reclassification operations described above. For example, the storage device reclassification engine 304 may be configured to generate a storage device reclassification Graphical User Interface (GUI) that includes storage device reclassification information, and provide that storage device reclassification GUI for display on a display device (e.g., the display 110 discussed above with reference to FIG. 1) that may be included on the storage device reclassification device(s) 202/300, coupled to the storage device reclassification device(s) 202/300, included on a computing device that is coupled to the storage device reclassification device(s) 202/300 via a network, and/or provided in any other manner that would be apparent to one of skill in the art in possession of the present disclosure. As such, in some embodiments of block 506, the storage device reclassification engine 304 may provide storage device reclassification information for display that indicates that the storage device 204a/400 should retain its first classification (e.g., that the storage device 204a/400 should be classified as an "enterprise" SSD storage device).

If at decision block 504, it is determined that reduced capabilit(ies) of the NAND storage subsystem were identified, the method 500 proceeds to block 508 where the storage device reclassification device(s) determine storage device operation modification(s) based on the reduced capabilit(ies) of the NAND storage subsystem. In an embodiment, at block 508 and in response to identifying reduced capabilities of the NAND storage system 406, the storage device reclassification engine 304 in the storage device reclassification device(s) 202/300 may determine one or more storage device operation modifications based on those reduced capabilities of the NAND storage system 406.

Continuing with the specific example of the log analysis testing operations/log analysis testing results discussed above, in response to determining at decision block 504 that the storage subsystem P/E cycle information indicates a reduced capability of the storage subsystem 406, the storage device reclassification engine 304 may determine storage device operation modification(s) based on those reduced capabilit(ies). For example, in the event the uniformity of P/E cycle count per NAND block in the NAND storage subsystem 406 and/or the total P/E cycle count per NAND block in the storage subsystem 406 is indicative of a reduced capability of the storage subsystem 406, the storage device reclassification engine 304 may determine storage device operation modification(s) that may include a storage firmware configuration that is configured to cause the storage engine 404a in the storage firmware 404 to selectively target NAND blocks in the NAND storage subsystem 406 that have relatively lower P/E cycles relative to other NAND blocks in the NAND storage subsystem 406.

For example, one of skill in the art in possession of the present disclosure will recognize that SSD storage devices that utilize NAND storage subsystem may include a relatively substantial portion of the NAND storage subsystem that remains unused (and which is often referred to as "overprovisioned (OP)" space). Furthermore, such OP space may be used to move data around during normal operation or garbage collection by the storage device, utilized as "spare" space to handle retirement of NAND blocks that have been identified as "bad", and/or utilized due to the mismatch in the size of program operations that occur on a NAND wordline level and the size of erase operations that occur on a NAND block level. To provide a specific example, once enough NAND pages in a programmed NAND block are marked for deletion, "good" NAND pages may be collected, along with "good" NAND pages marked for deletion, and may be written to empty NAND blocks. Furthermore, once this data is written to the new location, the old NAND blocks may be erased and returned to a pool of "ready" NAND blocks. One of skill in the art in possession of the present disclosure will appreciate how knowledge of the individual P/E cycle count for each NAND block may allow storage firmware to use lower P/E count NAND blocks more frequently than higher P/E count NAND blocks in such background data operations (when possible). Furthermore, while storage firmware may operate to level the P/E cycles in general, a relatively more aggressive algorithmic treatment that effectively removes high P/E NAND blocks from targeting may be employed for reclassified storage devices.

As will be appreciated by one of skill in the art in possession of the present disclosure, selective targeting of NAND blocks with relatively lower P/E cycles in response to reduced capabilities indicated by the uniformity of P/E cycle count per NAND block in the NAND storage subsystem 406 and/or the total P/E cycle count per NAND block in the storage subsystem 406 may operate to provide a storage device that has "reduced datasheet" capacity (e.g., relative to the "original datasheet" capacity), with relatively higher P/E cycle NAND blocks removed from service, and relatively lower P/E cycle NAND blocks utilized.

In another example, in response to determining at decision block 504 that the storage subsystem failure information indicates a reduced capability of the storage subsystem 406, the storage device reclassification engine 304 may determine storage device operation modification(s) based on those reduced capabilit(ies). For example, in the event the program operation failures and/or the erase operation failures associated with NAND die in the storage subsystem 406 is indicative of a reduced capability of the storage subsystem 406, the storage device reclassification engine 304 may determine storage device operation modification(s) that may include a storage firmware configuration that is configured to cause the storage engine 404a in the storage firmware 404 to determine problem area concentrations at a NAND die level, a NAND block level, a NAND wordline level, and/or at other NAND storage subsystem granularities that would be apparent to one of skill in the art in possession of the present disclosure.

For example, program failures may indicate that a NAND block could not be written to (e.g., via a NAND wordline in that NAND block), or that a programmed voltage could not be verified, which one of skill in the art in possession of the present disclosure will recognize essentially indicates that the NAND media is compromised at that level and should no longer be used. Similarly, a NAND block with an erase failure may indicate that an erase operation to remove the previously stored voltages has failed, or that verification of the erase operation failed, which one of skill in the art in possession of the present disclosure will recognize indicates a situation where the NAND block should be removed from service. One of skill in the art in possession of the present disclosure will appreciate that a NAND block with an isolated program or erase failure is not an unexpected result, and storage firmware in the storage device may be configured with functionality to handle such situations during its normal operation. However, in the event numerous program or erase failures occur on a NAND die or NAND plane, that may be indicative that NAND die is unreliable (e.g., due to defects introduced during its manufacture), has compromised voltage measurement or programming circuitry, etc. As such, in such situations any physical NAND blocks that share the same "bad" NAND die/NAND plane or measurement circuitry may be removed from service to ensure that the reliable operation of the storage device is maintained.

Continuing with the specific example of the error testing operations/error testing results discussed above, in response to determining at decision block 504 that the storage subsystem error information is indicative of a reduced capability of the storage subsystem 406, the storage device reclassification engine 304 may determine storage device operation modification(s) based on those reduced capabilit(ies). For example, in the event the "bit flipped" count is indicative of a reduced capability of the storage subsystem 406, the storage device reclassification engine 304 may determine storage device operation modification(s) that may include a storage firmware configuration that is configured to cause the storage engine 404a in the storage firmware 404 to monitor particular NAND die or NAND blocks (e.g., based on those NAND die or NAND blocks having reduced capabilities or otherwise being "weak"), convert NAND cell(s) in a NAND block to a lower data storage density (e.g., from storing 8 bits per NAND cell to storing 3 bits per NAND cell), and/or prevent the use of particular NAND elements.

For example, the conversions discussed above may be from TLC (e.g., 3 bits/cell or 8 bit states) to MLC (e.g., 2 bits/cell or 4 bit states), or even SLC (e.g., 1 bit/cell or 2 bit states). Furthermore, regardless of the bit coding used (e.g., TLC, MCL, SLC, etc.), NAND storage subsystems will store an analog voltage. For TLC, the analog voltage range of the analog voltage stored by the NAND storage subsystem is divided into 8 sections that are separable in order to determine the bit state of any particular bit, and a difficulty may arise when the NAND gate voltage varies due to, for example, aging (e.g., P/E cycling), data retention effects, or other issues known in the art, which makes it difficult to separate the corresponding 8 states available in a NAND cell. In such scenarios, voltages read from the NAND storage subsystem will differ from those that were programmed, resulting in flipped bits. However, if the voltage range is instead divided into 4 possible states rather than 8 possible states (e.g., as in MLC), additional capability will exist to separate bit states from each other, but at the expense of capacity (e.g., a 50% capacity reduction in the example above of converting from 3 bits per cell to 2 bits per cell). As such, in situations in which a high FBC on a NAND die or NAND block level suggests that error can no longer be sufficiently corrected (e.g., data would be at risk with continued use of those NAND die or NAND blocks), a reduction in the coding from TLC to MLC or SLC may allow for continued use of the storage subsystem at the lower capacity.

In different embodiments, preventing the use of NAND elements may include preventing the use of NAND wordlines, NAND blocks, NAND die, NAND packages, and/or other NAND elements known in the art. For example, a Firmware Translation Layer (FTL) may be used to prevent the use of NAND die and NAND blocks (e.g., by programming the FTL to not use the NAND die or NAND blocks), while the prevention of the use of NAND wordlines may involve programming the FTL. For example, a NAND block may include many physical layers of fabricated material, and those physical layers are subject to manufacturing differences, as well as edge effects on the layers bounding other components within a NAND die or NAND package. As such, some NAND wordlines may behave relatively well, while other may behave relatively poorly from an FBC point of view, especially at high PE cycle counts. Thus, removing offending NAND wordlines from service may allow for continued operation of the rest of the NAND block, which may comprise many hundreds of good NAND wordlines. The programming of FTL to allow for NAND wordline removal may include programming the FTL to track the "bad" NAND wordlines in a particular NAND block, and prevent them from being programmed. Additionally, NAND wordlines in NAND blocks may be "open" or "closed", with NAND wordlines considered "open" until their adjacent NAND wordlines are also programmed. Thus, in order to prevent impact to good NAND wordlines, if neighboring/adjacent NAND wordlines are identified as "bad", the FTL may be configured to program those "bad" wordlines with random data such that they are not used to store user data. As such, the end result will be reduced NAND capacity, but less so than if entire NAND blocks are retired.

As will be appreciated by one of skill in the art in possession of the present disclosure, monitoring particular NAND die or NAND blocks, converting NAND cell(s) in a NAND block to a lower data storage density, and/or preventing the use of particular NAND blocks in response to reduced capabilities indicated by a "bit flipped" count in the storage subsystem may operate to provide a storage device operates similarly to an "enterprise" storage device but with a reduced capacity.

Continuing with the specific example of the powered-on data retention testing operations/powered-on data retention testing results discussed above, in response to determining at decision block 504 that the storage subsystem powered-on data retention information is indicative of a reduced capability of the storage subsystem 406, the storage device reclassification engine 304 may determine storage device operation modification(s) based on those reduced capabilit(ies), and one of skill in the art in possession of the present disclosure will appreciate how storage subsystem powered-on data retention information may be utilized to performed "individualized tuning" of the storage firmware 404 in the storage device 400. To provide a specific example related to powered-on data retention testing operations or powered-off data retention testing operations discussed above, in addition to simply checking the FBC during the testing phase, a more detailed characterization effort may be performed in order to provide additional information, and instead of the NAND gate voltage thresholds stored in the original storage firmware, other candidate voltages may be tested to reduce FBC. Thus, for each NAND die, individualized voltage thresholds may be determined for a present, elevated P/E cycle state of the NAND storage subsystem that provides the best error correction performance.

For example, in the event the "bit flipped" count and/or the NAND bit distribution data is indicative of a reduced capability of the storage subsystem 406, the storage device reclassification engine 304 may determine storage device operation modification(s) that may include a storage firmware configuration that is configured to cause the storage engine 404a in the storage firmware 404 to monitor particular NAND die or NAND blocks (e.g., based on those NAND die or NAND blocks having reduced capabilities or otherwise being "weak"), convert NAND cell(s) in a NAND block to a lower data storage density (e.g., from storing 8 bits per NAND cell to storing 3 bits per NAND cell) based on the data retention susceptibility of those NAND cells, prevent the use of particular NAND blocks based on the data retention susceptibility of those NAND cells, and/or utilize the NAND bit distribution data to optimize handling and/or improve inputs into Error Correction Code (ECC) operations. For example, as an alternative to the individualized tuning discussed above, powered-off data retention testing may result in a list of NAND wordlines or NAND blocks that showed elevated ECC/retry operations or outright data losses, and that information may be used to further mark certain NAND blocks as "bad" to use in continued operation, while the existence of relatively high numbers of problematic NAND blocks may suggest the retirement of an entire NAND plane or NAND die. In the event a sufficiently large population of NAND blocks is retired, the "datasheet" capacity of the drive may be impacted, and may need to be adjusted (e.g., to indicate a lower capacity) for secondary usage.

As will be appreciated by one of skill in the art in possession of the present disclosure, monitoring particular NAND die or NAND blocks, converting NAND cell(s) in a NAND block to a lower data storage density, preventing the use of particular NAND blocks, and/or utilizing NAND bit distribution data to optimize handling and/or improve inputs into Error Correction Code (ECC) operations in response to reduced capabilities indicated by a "bit flipped" count in the storage subsystem and/or NAND bit distribution data may operate to provide a storage device that operates similarly to an "enterprise" storage device but with a reduced capacity.

Continuing with the specific example of the powered-off data retention testing operations/powered-off data retention testing results discussed above, in response to determining at decision block 504 that the storage subsystem powered-off data retention information is indicative of a reduced capability of the storage subsystem 406, the storage device reclassification engine 304 may determine storage device operation modification(s) based on those reduced capabilit(ies), and one of skill in the art in possession of the present disclosure will appreciate how storage subsystem powered-off data retention information may be utilized to performed "individualized tuning" of the storage firmware 404 in the storage device 400 (e.g., to utilize voltage thresholds that performed best during testing to provide read voltage thresholds for each NAND die in powered-on situations, powered-off situations, etc., similarly as described above). For example, in the event the "bit flipped" count and/or NAND bit distribution data is indicative of a reduced capability of the storage subsystem 406, the storage device reclassification engine 304 may determine storage device operation modification(s) that may include a storage firmware configuration that is configured to cause the storage engine 404a in the storage firmware 404 to monitor particular NAND die or NAND blocks (e.g., based on those NAND die or NAND blocks having reduced capabilities or otherwise being "weak"), convert NAND cell(s) in a NAND block to a lower data storage density (e.g., from storing 8 bits per NAND cell to storing 3 bits per NAND cell) based on the data retention susceptibility of those NAND cells, prevent the use of particular NAND blocks based on the data retention susceptibility of those NAND cells, and/or utilize the NAND bit distribution data to optimize handling and/or improve inputs into Error Correction Code (ECC) operations.

As will be appreciated by one of skill in the art in possession of the present disclosure, monitoring particular NAND die or NAND blocks, converting NAND cell(s) in a NAND block to a lower data storage density, preventing the use of particular NAND blocks, and/or utilizing NAND bit distribution data to optimize handling and/or improve inputs into Error Correction Code (ECC) operations in response to reduced capabilities indicated by a "bit flipped" count in the storage subsystem and/or NAND bit distribution data may operate to provide a storage device that operates similarly to an "enterprise" storage device but with a reduced capacity.

Continuing with the specific example of the hardware subsystem "self-test" testing operations/hardware subsystem "self-test" testing results discussed above, in response to determining at decision block 504 that the storage subsystem hardware self-test information is indicative of a reduced capability of the storage subsystem 406, the storage device reclassification engine 304 may determine storage device operation modification(s) based on those reduced capabilit(ies). For example, in the event the indication of whether any particular storage hardware subsystem 408 passed or failed a self-test or the results of a margin test indicates a reduced capability of the storage subsystem 406, the storage device reclassification engine 304 may determine storage device operation modification(s) that may include decommissioning the storage device based on identified hardware subsystem failures that would limit performance of the storage device 204/400.

As will be appreciated by one of skill in the art in possession of the present disclosure, identifying hardware subsystem failures that may limit performance of the storage device 204/400 in response to reduced capabilities indicated by the passing or failing of a self-test or the results of a margin test may allow for the decommissioning of storage device subject to hardware failures that are no correctable via the modifications described herein.

While several specific examples of storage device operation modifications that may be determined in order to provide the storage device reclassification of the present disclosure have been described above, one of skill in the art in possession of the present disclosure will appreciate that those examples are not meant to limiting (e.g., to storage devices with NAND storage subsystems as in some of the examples above), and that any of a variety of storage device operation modifications that one of skill in the art in possession of the present disclosure would recognize as allowing the storage device reclassification described herein may be performed while remaining within the scope of the present disclosure as well. Furthermore, one of skill in the art in possession of the present disclosure will appreciate how any combination of storage device operation modifications like those described above may be determined at block 508 based on reduced capabilities identified for the storage subsystem 406.

Furthermore, in some embodiments, the determination of storage device operation modifications at block 508 may include determining a plurality of storage device operation modifications based on reduced capabilities identified for the storage subsystem 406, and then selecting a subset of the plurality of storage device operation modifications for performance on the storage device 204a/400. For example, as discussed above, the storage device reclassification engine 304 may be configured to convey storage device reclassification information to a user or other entity in control of the storage device reclassification operations via, for example, a storage device reclassification GUI. As such, in some embodiments of block 506, the storage device reclassification engine 304 may determine the plurality of storage device operation modifications, identify different classifications provided by subsets of those storage device operation modifications, and provide those classifications for display to a user so that they user may select one of those classifications to indicate which subset of storage device operation modifications should be performed on the storage device 204a/400 to change its classification.

To provide a specific example, the storage device 204a/400 may initially be configured to perform "enterprise" storage device operations associated with the "enterprise" SSD storage device classification, and at block 508 the storage device reclassification engine 304 may determine a "extended enterprise" set of storage device operation modifications that are associated with an "extended enterprise" SSD storage device classification and that may configure the storage device 204a/400 to meet the same original datasheet specifications as the "enterprise" SSD storage device classification but with extended P/E cycle specifications; a "reduced capacity enterprise" set of storage device operation modifications that are associated with a "reduced capacity enterprise" SSD storage device classification and that may configure the storage device 204a/400 to meet the same original datasheet specifications as the "enterprise" SSD storage device classification but at a reduced storage capacity; a "client" set of storage device operation modifications that are associated with a "client" SSD storage device classification and that may configure the storage device 204a/400 to operate at a reduced Quality of Service (QoS) and with a reduced data retention relative to the "enterprise" SSD storage device classification; a "cloud" set of storage device operation modifications that are associated with a "cloud" SSD storage device classification and that may configure the storage device 204a/400 to operate at a reduced Quality of Service (QoS), reduced storage capacity, and with a reduced number of write operations per day relative to the "enterprise" SSD storage device classification; and a "write-once/read-many" set of storage device operation modifications that are associated with a "write-once/read-many" SSD storage device classification and that may configure the storage device 204a/400 to operate at significantly reduced capabilities relative to the "enterprise" SSD storage device classification.

Thus, at block 508, the storage device reclassification engine 304 may provide the storage device reclassification GUI for display that identifies two or more of the "extended enterprise" SSD storage device classification, the "reduced capacity enterprise" SSD storage device classification, the "client" SSD storage device classification, the "cloud" SSD storage device classification, and the "write-once/read-many" SSD storage device classification. When the storage device reclassification engine 304 receives a selection of one of those SSD storage device classifications via the storage device reclassification GUI, the corresponding storage device operation modifications associated with that selected SSD storage device classification will then be determined at block 508. However, while the determination of multiple SSD storage device classifications and the selection of one of those SSD storage device classifications by a user is described above, one of skill in the art in possession of the present disclosure will appreciate how the determination of a single SSD storage device classification/set of storage device operation modifications and/or the performance of those storage device operation modifications on a storage device without the need for selection by a user will fall within the scope of the present disclosure as well.

Furthermore, while the display of different available reclassifications via a storage device reclassification GUI is described above, one of skill in the art in possession of the present disclosure will appreciate how the storage device reclassification GUI may instead be utilized to display what reduced capabilities will exist in the storage device 204a/400 in the event particular storage device operation modifications are performed on the storage device 204a/400 (e.g., by displaying a reduced capacity that will exist in the storage device 204a/400 in the event storage device operation modification(s) are performed, by displaying a reduced Quality of Service (QoS) that will exist in the storage device 204a/400 in the event storage device operation modification(s) are performed, by displaying a reduced performance that will exist in the storage device 204a/400 in the event storage device operation modification(s) are performed, etc.), which allows a user to select which of those storage device operation modification(s) should be performed on the storage device 204a/400.

Figure 8C:
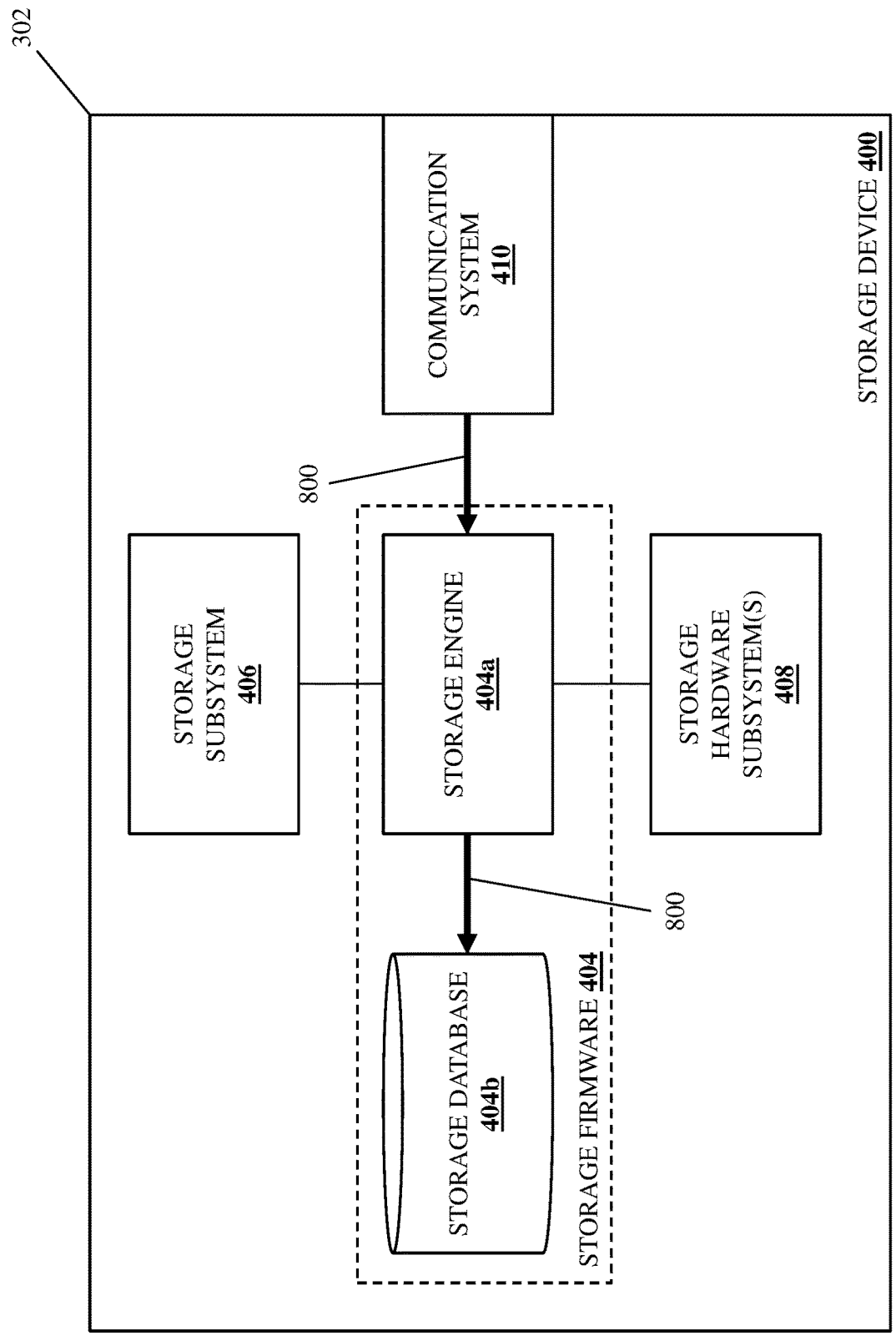
FIG. 8C is a schematic view illustrating an embodiment of the storage device of FIG. 4 operating during the method of FIG. 5.

The method 500 then proceeds to block 510 where the storage device reclassification device(s) perform the storage device operation modification(s) on the storage device to configure the storage device with a second classification. With reference to FIGS. 8A, 8B, and 8C, in an embodiment of block 510, the storage device reclassification engine 304 in the storage device reclassification device(s) 202/300 may perform storage device reclassification operations 800 on the storage device 204a/400 (via their respective communication systems 308 and 410) in order to perform the storage device operation modification(s) determined at block 508 on the storage device 204a/400 in order to configure the storage device 204a/400 to perform storage operations that are associated with a second SSD storage device classification. The embodiment illustrated in FIG. 8C provide an example in which the storage device reclassification operations 800 operate to modify the storage engine 404a and storage database 404b in the storage firmware 404, but one of skill in the art in possession of the present disclosure will appreciate how modifications to the storage subsystem 406 and/or the storage hardware subsystems 408 will fall within the scope of the present disclosure as well.

Continuing with the specific example above, at block 510, the storage device 204a/400 that was initially configured to perform the "enterprise" set of storage device operations associated with an "enterprise" SSD storage device classification may be configured with the "extended enterprise" set of storage device operation modifications associated with the "extended enterprise" SSD storage device classification, the "reduced capacity enterprise" set of storage device operation modifications that are associated with the "reduced capacity enterprise" SSD storage device classification, the "client" set of storage device operation modifications that are associated with the "client" SSD storage device classification, the "cloud" set of storage device operation modifications that are associated with the "cloud" SSD storage device classification, or the "write-once/read-many" set of storage device operation modifications that are associated with the "write-once/read-many" SSD storage device classification. However, while several specific SSD storage device classifications and associated storage device operation modifications are described above, one of skill in the art in possession of the present disclosure will appreciate how a storage device may be reclassified in any of a variety of manners according to the teachings of the present disclosure while remaining within its scope.

As discussed above, one result of the storage device reclassification operations described herein is to reduce the storage capacity (the "nameplate capacity" or storage capacity identified in an original datasheet specification) of storage devices when, for example, testing operations performed on a storage device indicate that the storage device includes capabilities below its current classification (e.g., below its original datasheet specifications). For example, such storage capacity reductions may be realized by preventing the use of problematic NAND blocks, increasing over-provisioning (e.g., the amount of "extra" space utilized to perform internal storage device operations), and/or performing other storage capacity reduction storage operation modifications that would be apparent to one of skill in the art in possession of the present disclosure. For example, storage device reclassification operations may reduce write amplification in order to maximize the remaining life of the NAND storage subsystem. As will be appreciated by one of skill in the art in possession of the present disclosure, each time a storage device is written, the number of P/E cycles observed by the NAND storage subsystem will be a multiple of the actual storage device writes, with the ratio of those writes known as the "write amplification" factor, which is highly dependent on the amount of over-provisioning in the drive. For example, values in enterprise SSD storage devices are often in the 4-5 range for write amplification. One of skill in the art in possession of the present disclosure will recognize that, because of the non-linear relationship between over-provisioning and write amplification, increasing over-provisioning a small amount may drastically reduce write amplification and, as such, reduce the number of P/E cycles accumulated for continued use of the NAND.

As also discussed above, the storage device reclassification operations described herein may adjust NAND coding operations of storage devices when, for example, testing operations performed on a storage device indicate that the storage device includes capabilities below its current classification (e.g., below its original datasheet specifications). For example, such NAND coding operation adjustment may be realized by recoding a storage device to a lower bit density (e.g., reconfiguring a storage device that is configured to perform Quad Level Cell (TLC) coding in the NAND cells in its NAND storage subsystem to perform Triple Level Cell (TLC), reconfiguring a storage device that is configured to perform Triple Level Cell (TLC) coding in the NAND cells in its NAND storage subsystem to perform Multi Level Cell (MLC), etc.). As will be appreciated by one of skill in the art in possession of the present disclosure, the NAND coding adjustment discussed above will be associated with corresponding storage capacity reductions, and may operate to accommodate relatively higher P/E cycle tolerance.

As also discussed above, the storage device reclassification operations described herein may utilize voltage sweep results from requalification testing to "tune" storage firmware based on the capabilities of storage devices when, for example, testing operations performed on a storage device indicate that the storage device includes capabilities below its current classification (e.g., below its original datasheet specifications). For example, the operation of storage firmware is often configured generally across different NAND dies, NAND blocks, NAND wordlines, and NAND cycle counts, and the storage device operation modifications described herein may be utilized to modify storage firmware based on specific capability reductions identified in its storage device (e.g., as that storage device approaches the end of its lifetime), "tune" that storage firmware (e.g., at a NAND die level, NAND block level, or even NAND wordline level) to improve error rates, and configure the storage firmware to perform additional "retry" operations based on increased need as the storage device approaches the end of its lifetime. In a specific example, storage firmware "tuning" may include modifying storage firmware to change voltage thresholds used to read data from NAND cells so that data read errors (e.g., flipped bits) resulting from data read operations performed on NAND cells are reduced.

As also discussed above, the storage device reclassification operations described herein may increase Error Correction Code (ECC) capabilities based on the capabilities of storage devices when, for example, testing operations performed on a storage device indicate that the storage device includes capabilities below its current classification (e.g., below its original datasheet specifications). For example, the storage device operation modifications may provide for relatively more aggressive Redundant Array of Independent Disk (RAID) striping, lower code rates (and corresponding increased parity space), and/or other operations to handle relatively higher error rates in NAND storage subsystems as they approach the end of their lifetimes (i.e., at the cost of storage capacity).

As also discussed above, the storage device reclassification operations described herein may increase scanning, monitoring, and/or handling operations based on the capabilities of storage devices when, for example, testing operations performed on a storage device indicate that the storage device includes capabilities below its current classification (e.g., below its original datasheet specifications). For example, the storage device operation modifications may provide for increased Flipped Bit Correction (FBC) scanning, NAND block retirement, and/or other operations that are configured to preemptively address possible issues in NAND storage subsystems as they approach the end of their lifetimes (i.e., at the cost of QoS and host system processing bandwidth).

As also discussed above, the storage device reclassification operations described herein may significantly lower the performance requirements of the storage device based on the capabilities of storage devices when, for example, testing operations performed on a storage device indicate that the storage device includes capabilities below its current classification (e.g., below its original datasheet specifications). For example, the storage device reclassification may provide for a significantly reduced Drive Writes Per Day (DWPD) for the storage device (e.g., while keeping the storage capacity approximately the same), reduced latency specifications for the storage device (e.g., to allow for more frequent ECC operations), and reduced specification tolerance for data retention (e.g., from a 3-month data retention specification tolerance to a 1-month data retention specification tolerance).

With reference to FIG. 9, a table 900 is illustrated that provides a specific example of relatively more complex storage subsystem capability identifications and storage device operation modifications (with corresponding outcomes). As will be appreciated by one of skill in the art in possession of the present disclosure, the table 900 utilizes three testing operations that provide a P/E cycle margin to end of life testing result, a good NAND block/NAND die count testing result, and a Flipped Bit Correction (FBC) behavior testing result, with the testing results expressed as "GOOD", "MARGINAL", or "BAD". One of skill in the art in possession of the present disclosure will appreciate how the teachings provided above may be utilized with testing results detailed in the table 900 to determine the storage device operation modifications identified in the table 900 that will provide for classifications with the outcomes identified in the table 900.

In some embodiments, at least some of the storage device operation modifications discussed above as being performed on a storage device may be identified using information learned about related storage devices. For example, one of skill in the art in possession of the present disclosure will recognize that any storage device will be one of a plurality of storage devices that are the same type of storage device with the same components and same original datasheet specifications (i.e., a type of storage device provided to a plurality of different/discrete users). As such, any information about those storage devices may be determined (e.g., via field reliability testing, qualification testing, characterization testing, etc. by a storage device manufacturer/vendor) and stored in a database (e.g., the storage device reclassification database 306, a database that is accessible to the storage device reclassification engine 304 via a network, etc.) That information may then be utilized during block 508 of the method to determine the storage device operation modifications, which allows the storage device being reclassified to be modified based on information identified about other storage devices of the same type.

For example, it may be determined that storage devices of a particular type include a "bad" portion of the storage subsystem that is associated with storage operation failures (e.g., read operation errors, write operation errors, erase operation errors, etc.), storage errors (e.g., flipped bits), etc., and thus a storage device being reclassified may be provided with a storage device operation modification that causes it to prevent the use of that portion of their storage subsystem. As such, storage devices may have their storage device operation modified to produce a greater end-of-life P/E cycle count for that storage device than was originally specified, produce improved NAND usage guidance for better performance by preemptively decommissioning or performing more detailed monitoring of NAND blocks based on particular date code/lot results, retiring NAND blocks early if an error rate of a NAND page in a NAND block exceeds a NAND block failure threshold, and/or performing other modifications that would be apparent to one of skill in the art in possession of the present disclosure.

Thus, systems and methods have been described that provide for the modification of the operation of storage devices in order to reclassify those storages devices when testing operations determine that the NAND storage subsystem in those storage devices has reduced capabilit(ies). For example, the storage device reclassification system of the present disclosure may include a storage device reclassification subsystem coupled to a storage device that has a NAND storage subsystem and that is configured to perform first storage operations associated with a first storage device classification. The storage device reclassification subsystem performs testing operations on the NAND storage subsystem and, based on the testing operations, identifies at least one reduced capability of the NAND storage subsystem. Based on the at least one reduced capability of the NAND storage subsystem, the storage device reclassification subsystem determines at least one storage device operation modification and performs the at least one storage device operation modification on the storage device in order to configure the storage device to perform second storage operations that are different than the first storage operations and that are associated with a second storage device classification that is different than the first storage device classification. As such, storage devices with NAND storage subsystems having reduced capabilities due to, for example, previous use of those storage devices, may be reconfigured to perform modified storage operations in order to reclassify those storage devices for use in reduced-storage-requirement scenarios.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A storage device reclassification system, comprising:
   a storage device that includes a NAND storage subsystem and that is configured to perform first storage operations associated with a first storage device classification; and
   a storage device reclassification subsystem that is coupled to the storage device and that is configured to:
      perform testing operations on the NAND storage subsystem;
      identify, based on the testing operations, at least one reduced capability of the NAND storage subsystem;
      determine, based on the at least one reduced capability of the NAND storage subsystem, at least one storage device operation modification; and
      perform the at least one storage device operation modification on the storage device in order to configure the storage device to perform second storage operations that are different than the first storage operations and that are associated with a second storage device classification that is different than the first storage device classification.

2. The system of claim 1, wherein the storage device reclassification subsystem is configured to:
   generate, based on the at least one reduced capability of the NAND storage subsystem, a storage device reclassification Graphical User Interface (GUI) that identifies the second storage device classification associated with the second storage operations, and a third classification that is different than the first storage device classification and the second storage device classification and that is associated with third storage operations that are different than the first storage operations and the second storage operations;
   provide, for display, the storage device reclassification GUI;
   receive, via the storage device reclassification GUI, a selection of the second storage device classification, wherein the at least one storage device operation modification is determined based on the selection of the second storage device classification.

3. The system of claim 1, wherein the first storage operations include accessing at least a subset of the NAND storage subsystem at a first rate, and the second storage operations includes accessing the at least the subset of the NAND storage subsystem at a second rate that is different than the first rate.

4. The system of claim 1, wherein the first storage operations include storing data in at least a subset of the NAND storage subsystem at a first data storage density, and the second storage operations storing data in the at least the subset of the NAND storage subsystem at a second data storage density that is different than the first data storage density.

5. The system of claim 1, wherein the first storage operations include providing first error correction capabilities with data stored in at least a subset of the NAND storage subsystem, and the second storage operations include providing second error correction capabilities with data stored in the at least the subset of the NAND storage subsystem that are different than the first error correction capabilities.

6. The system of claim 1, wherein the first storage operations include performing NAND storage subsystem scanning of at least a subset of the NAND storage subsystem at a first scanning frequency, and the second storage operations include performing NAND storage subsystem scanning of the at least the subset of the NAND storage subsystem at a second scanning frequency that is different than the first scanning frequency.

7. An Information Handling System (IHS), comprising:
   a processing system; and
   a memory system that is coupled to the processing system and that includes instructions that, when executed by the processing system, cause the processing system to provide a storage device reclassification engine that is configured to:
      perform testing operations on a NAND storage subsystem in a storage device that is configured to perform first storage operations associated with a first storage device classification;
      identify, based on the testing operations, at least one reduced capability of the NAND storage subsystem;
      determine, based on the at least one reduced capability of the NAND storage subsystem, at least one storage device operation modification; and
      perform the at least one storage device operation modification on the storage device in order to configure the storage device to perform second storage operations that are different than the first storage operations and that are associated with a second storage device classification that is different than the first storage device classification.

8. The IHS of claim 7, wherein the storage device reclassification engine is configured to:
   generate, based on the at least one reduced capability of the NAND storage subsystem, a storage device reclassification Graphical User Interface (GUI) that identifies the second storage device classification associated with the second storage operations, and a third classification that is different than the first storage device classification and the second storage device classification and that is associated with third storage operations that are different than the first storage operations and the second storage operations;

provide, for display, the storage device reclassification GUI;

receive, via the storage device reclassification GUI, a selection of the second storage device classification, wherein the at least one storage device operation modification is determined based on the selection of the second storage device classification.

9. The IHS of claim 7, wherein the first storage operations include accessing at least a subset of the NAND storage subsystem at a first rate, and the second storage operations includes accessing the at least the subset of the NAND storage subsystem at a second rate that is different than the first rate.

10. The IHS of claim 7, wherein the first storage operations include storing data in at least a subset of the NAND storage subsystem at a first data storage density, and the second storage operations storing data in the at least the subset of the NAND storage subsystem at a second data storage density that is different than the first data storage density.

11. The IHS of claim 7, wherein the first storage operations include providing first error correction capabilities with data stored in at least a subset of the NAND storage subsystem, and the second storage operations include providing second error correction capabilities with data stored in the at least the subset of the NAND storage subsystem that are different than the first error correction capabilities.

12. The IHS of claim 7, wherein the first storage operations include performing NAND storage subsystem scanning of at least a subset of the NAND storage subsystem at a first scanning frequency, and the second storage operations include performing NAND storage subsystem scanning of the at least the subset of the NAND storage subsystem at a second scanning frequency that is different than the first scanning frequency.

13. The IHS of claim 7, wherein the first storage operations include accessing at least a subset of the NAND storage subsystem according to first NAND access parameters, and the second storage operations include accessing the at least the subset of the NAND storage subsystem according to second NAND access parameters that are different than the first NAND access parameters.

14. A method for reclassifying storage devices, comprising:

performing, by at least one storage device reclassification device, testing operations on a NAND storage subsystem in a storage device that is configured to perform first storage operations associated with a first storage device classification;

identifying, by the at least one storage device reclassification device based on the testing operations, at least one reduced capability of the NAND storage subsystem;

determining, by the at least one storage device reclassification device based on the at least one reduced capability of the NAND storage subsystem, at least one storage device operation modification; and performing, by the at least one storage device reclassification device, the at least one storage device operation modification on the storage device in order to configure the storage device to perform second storage operations that are different than the first storage operations and that are associated with a second storage device classification that is different than the first storage device classification.

15. The method of claim 14, further comprising:

generating, by the at least one storage device reclassification device based on the at least one reduced capability of the NAND storage subsystem, a storage device reclassification Graphical User Interface (GUI) that identifies the second storage device classification associated with the second storage operations, and a third classification that is different than the first storage device classification and the second storage device classification and that is associated with third storage operations that are different than the first storage operations and the second storage operations;

providing, by the at least one storage device reclassification device for display, the storage device reclassification GUI;

receiving, by the at least one storage device reclassification device via the storage device reclassification GUI, a selection of the second storage device classification, wherein the at least one storage device operation modification is determined based on the selection of the second storage device classification.

16. The method of claim 14, wherein the first storage operations include accessing at least a subset of the NAND storage subsystem at a first rate, and the second storage operations includes accessing the at least the subset of the NAND storage subsystem at a second rate that is different than the first rate.

17. The method of claim 14, wherein the first storage operations include storing data in at least a subset of the NAND storage subsystem at a first data storage density, and the second storage operations storing data in the at least the subset of the NAND storage subsystem at a second data storage density that is different than the first data storage density.

18. The method of claim 14, wherein the first storage operations include providing first error correction capabilities with data stored in at least a subset of the NAND storage subsystem, and the second storage operations include providing second error correction capabilities with data stored in the at least the subset of the NAND storage subsystem that are different than the first error correction capabilities.

19. The method of claim 14, wherein the first storage operations include performing NAND storage subsystem scanning of at least a subset of the NAND storage subsystem at a first scanning frequency, and the second storage operations include performing NAND storage subsystem scanning of the at least the subset of the NAND storage subsystem at a second scanning frequency that is different than the first scanning frequency.

20. The method of claim 14, wherein the first storage operations include accessing at least a subset of the NAND storage subsystem according to first NAND access parameters, and the second storage operations include accessing the at least the subset of the NAND storage subsystem according to second NAND access parameters that are different than the first NAND access parameters.

* * * * *